(12) United States Patent
Minegishi et al.

(10) Patent No.: US 6,653,179 B1
(45) Date of Patent: Nov. 25, 2003

(54) METHOD FOR MANUFACTURING A THIN FILM SEMICONDUCTOR DEVICE, METHOD FOR MANUFACTURING A DISPLAY DEVICE, METHOD FOR MANUFACTURING A THIN FILM TRANSISTORS, AND METHOD FOR FORMING A SEMICONDUCTOR THIN FILM

(75) Inventors: Masahiro Minegishi, Aichi (JP);
Yasushi Shimogaichi, Kanagawa (JP);
Makoto Takatoku, Kanagawa (JP);
Hisao Hayashi, Aichi (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/743,899

(22) PCT Filed: Jul. 16, 1999

(86) PCT No.: PCT/JP99/03843
§ 371 (c)(1),
(2), (4) Date: Mar. 29, 2001

(87) PCT Pub. No.: WO00/04572
PCT Pub. Date: Jan. 27, 2000

(30) Foreign Application Priority Data

| Jul. 17, 1998 | (JP) | 10-202407 |
| Aug. 20, 1998 | (JP) | 10-233391 |
| Oct. 6, 1998 | (JP) | 10-283645 |
| Dec. 24, 1998 | (JP) | 10-366277 |

(51) Int. Cl.⁷ ............................................. H01L 21/00
(52) U.S. Cl. ..................................... 438/166; 438/149
(58) Field of Search ......................... 438/30, 166, 308, 438/535, 795, 487, 149–151, 169, 92, 150

(56) References Cited

U.S. PATENT DOCUMENTS

| 5,888,839 A | * | 3/1999 | Ino et al. | 438/30 |
| 5,923,966 A | * | 7/1999 | Teramoto et al. | 438/162 |
| 6,015,720 A | * | 1/2000 | Minegishi et al. | 438/30 |
| 6,071,765 A | * | 6/2000 | Noguchi et al. | 438/166 |
| 6,166,399 A | * | 12/2000 | Zhang et al. | 257/72 |
| 6,248,606 B1 | * | 6/2001 | Ino et al. | 438/30 |
| 6,369,507 B1 | * | 4/2002 | Arai | 313/506 |

FOREIGN PATENT DOCUMENTS

| JP | 6-132219 | 5/1994 |
| JP | 6-295859 | 10/1994 |
| JP | 7-302913 | 11/1995 |
| JP | 8-250438 | 9/1996 |
| JP | 10-12950 | 1/1998 |

* cited by examiner

Primary Examiner—David Nelms
Assistant Examiner—Vu David
(74) Attorney, Agent, or Firm—Rader, Fishman & Grauer PLLC; Ronald P. Kananen, Esq.

(57) ABSTRACT

For manufacturing a thin film semiconductor device, first conducted is a film-making step to make a non-single-crystalline semiconductor thin film (4) on an insulating substrate (1). Next conducted is an annealing step to irradiate laser light (50) for once heating and melting the non-single-crystalline semiconductor thin film (4) and then changing it into a polycrystal in its cooling process. Thereafter, a processing step is conducted to form thin film transistors in an integrated form, which includes the polycrystalline semiconductor thin film (4) as their active layer. For the purpose of ensuring uniform crystallization and enlargement of grain sizes, in the annealing step, by using a laser oscillator (51) including an excimer laser source, the laser light (50) having a pulse width not shorter than 50 ns is shaped by an optical system (53) to form a rectangular cross-sectional area whose sides are not shorter than 10 mm to sequentially irradiate the semiconductor thin film (4).

25 Claims, 18 Drawing Sheets

4-TIMES IRRADIATED REGION

4-TIMES IRRADIATED REGION
4-TIMES IRRADIATED REGION
8-TIMES IRRADIATED REGION

4-TIMES IRRADIATED REGION
4-TIMES IRRADIATED REGION
8-TIMES IRRADIATED REGION
8-TIMES IRRADIATED REGION
8-TIMES IRRADIATED REGION
4-TIMES IRRADIATED REGION
16-TIMES IRRADIATED REGION
8-TIMES IRRADIATED REGION
4-TIMES IRRADIATED REGION

ONE-TIME IRRADIATED REGION

ONE-TIME IRRADIATED REGION  
ONE-TIME IRRADIATED REGION  
2-TIMES IRRADIATED REGION

ONE-TIME IRRADIATED REGION  
ONE-TIME IRRADIATED REGION  
2-TIMES IRRADIATED REGION  
2-TIMES IRRADIATED REGION  
2-TIMES IRRADIATED REGION  
ONE-TIME IRRADIATED REGION  
4-TIMES IRRADIATED REGION  
2-TIMES IRRADIATED REGION  
ONE-TIME IRRADIATED REGION

| | |
|---|---|
| 1 | INSULATING SUBSTRATE |
| 2 | SEMICONDUCTOR THIN FILM |
| 3, 4 | GATE INSULATING FILM |
| 5 | GATE ELECTRODE |
| 6 | FIRST INTER-LAYER INSULATING FILM |
| 8 | SECOND INTER-LAYER INSULATING FILM |
| 50 | LASER LIGHT |
| 73 | CATALYTIC BODY |

METHOD FOR MANUFACTURING A THIN FILM SEMICONDUCTOR DEVICE, METHOD FOR MANUFACTURING A DISPLAY DEVICE, METHOD FOR MANUFACTURING A THIN FILM TRANSISTORS, AND METHOD FOR FORMING A SEMICONDUCTOR THIN FILM

DESCRIPTION

Method for manufacturing a thin film semiconductor device, method for manufacturing a display device, method for manufacturing thin film transistors, and method for forming a semiconductor thin film.

TECHNICAL FIELD

This invention relates to a method for manufacturing thin film semiconductor devices involving thin film transistors formed in an active matrix type display device in an integrated form. More particularly, the invention relates to a method for forming polycrystalline semiconductor thin film transistors.

BACKGROUND ART

Crystallization annealing by laser light has been developed as a part of technologies to proceed with the manufacturing process of thin film semiconductor devices under low temperatures. This technique first irradiates laser light onto a semiconductor thin film of a non-single-crystalline material such as amorphous silicon or polycrystalline silicon with a relatively small grain size, which is formed on an insulating substrate, to locally heat it, and then makes the semiconductor film change into a polycrystal with a relatively large grain size during its cooling process (crystallization). The crystallized semiconductor thin film is used as an active layer (channel region) to integrally build thin film transistors. By employing this crystallization annealing, thin film semiconductor devices can be made under low process temperatures, and this enables the use of inexpensive glass substrates instead of expensive quartz substrates with a higher heat resistivity.

In crystallization annealing, line-shaped laser light normally elongated in the scanning direction is intermittently irradiated while making its shots partly overlapped. By overlapping shots of the laser light, the semiconductor thin film can be crystallized more uniformly. Crystallization annealing which uses line-shaped laser light (line beam) is schematically shown in FIG. 1. Laser light 50 shaped into a line extending in the Y direction of an insulating substrate 1 of glass, for example, is irradiated onto the surface of the insulating substrate 1 having formed a semiconductor thin film. In this process, the insulating film substrate 1 is moved in the X direction relative to the irradiated region. In this example, a line beam 50 released from an excimer laser source is irradiated intermittently in a partly overlapped fashion. That is, the insulating substrate 0 is scanned in the X direction relative to the line beam 50 through a stage. Crystallization annealing is conducted by moving the stage after each shot by a pitch smaller than the width of the line beam 50 to ensure that the line beam 50 can irradiate the entire surface of the insulating substrate 1. Excimer laser sources used in conventional crystallization annealing release pulses of 100 Hz or higher frequency, and the pulse width of each line beam is smaller than 50 ns.

Thin film semiconductor devices integrating thin film transistors are used in many active matrix type display devices, or the like. In order to realize display devices excellent in image quality, it is important to integrate thin film transistors having good operation properties all over the substrate. For this purpose, it is necessary to uniformly stack a semiconductor thin film of a polycrystal with a relatively large grain size. Additionally, needless to say, when taking the production yield into consideration, crystal grains having a large grain size must be uniformly built in all over the substrate. There are some methods for obtaining such a polycrystal, such as increasing the laser light irradiation energy, increasing the number of shots of overlapping irradiation, and making a crystal core in an amorphous semiconductor thin film before irradiation of laser light, for example. Even with these methods, however, no techniques have been successful in making sufficiently large, uniform crystal grains. Therefore, no system-on-panels remarked as the final target of low-temperature-process have been realized heretofore. A system-on-panel pertains to a device including built-in peripheral devices such as a video driver and a timing generator on a common substrate in addition to a switching element for driving pixels and thin film transistors used as horizontal scanners and vertical scanners. For realizing a system-on-panel, mobility u of individual thin film transistors has to be increased to 80 $cm^2/V \cdot s$ through 300 $cm^2/V \cdot s$. For this purpose, it is necessary to further decrease the grain size of polycrystalline semiconductor thin film.

As shown in FIG. 1, when the line beam is irradiated to partly overlap between one shot and another, streaks appear to extend in the direction (Y direction) normal to the forward direction (X direction). In a microscopic view, these streaks are unevenness in crystal grain size. When the thin film transistors are integrated on the insulating substrate, unevenness in crystal grain size is observed as unevenness of the operation property, and it is therefore difficult to fabricate a display device ensuring a high quality throughout the entire surface of the insulating substrate. The first object of the invention is directed to solution of these problems of conventional techniques and provides a method for obtaining a polycrystal having a uniform, large grain size all over the surface of the insulating substrate by irradiating laser light onto a semiconductor thin film.

Next explained is another problem the invention intends to overcome. Thin film transistors are widely used as switching elements of active matrix type display devices. Especially as the semiconductor thin film to form the active layer of thin film transistors, polycrystalline silicon has been used for years. Polycrystalline silicon thin film transistors are used not only as switching elements, but they can be used also as circuit elements, and peripheral driving circuits can be built in together with pixel-driving switching elements on a common substrate. However, to form these peripheral driving circuits, high-performance thin film transistors are required. Particularly, their mobility is desired to be high.

Solid phase growth has been known for years as a technique for making high-quality polycrystalline silicon on an insulating substrate. This is a method which makes a silicon film as a precursor film by LP-CVD and then anneals it. Regarding the relation between conditions of deposition by LP-CVD and subsequent heating and the crystal grain size, it is known desirable to form amorphous silicon at a temperature not higher than 580° C. and anneal it at about 600° C., for example, in order to obtain polycrystalline silicon with a large grain size. In case of solid phase growth by heating, if an amorphous silicon film is annealed at 600° C. for 12 hours, for example, the crystal grain size reaches 100 through 2000 nm. In general, the larger the grain size, the higher the mobility. However, in solid phase growth by annealing, crystal patterns are not constant, and a lot of twin crystal defects and dislocation defects are observed in crystal grains through a crystal image. Because of these defects, although polycrystalline. silicon obtained by solid phase growth has a large grain size, its mobility is only around 70 $cm^2/V \cdot s$.

Laser annealing has also been used as a technique for making high-quality polycrystalline silicon. With this method, silicon thin films can be crystallized at relatively low temperatures without heating the entire substrate so high. When laser light is irradiated onto a silicon thin film to be crystallized, the energy is absorbed only by the very surface of the silicon thin film. Thereafter, the inner portion of the thin film melts due to heat conduction, and re-crystallizes during its cooling process. In polycrystalline silicon films made in this manner, crystal grains are distributed about uniformly. Also when reviewing its lattice image, crystal defects are less than those by solid phase growth. However, in the case of laser annealing, the crystal grain size is relatively as small as 200 through 300 nm, a lot of crystal grain boundaries exist, and the mobility is around 40 $cm^2/V \cdot s$.

There is a recently developed technique for reducing crystal defects by adding laser annealing by excimer laser light after solid phase growth by annealing. It is disclosed, for example, in Japanese Patent Laid-Open Publication No. sho 62-104021 and Japanese Patent Laid-Open Publication No. hei 7-302913. However, even with this method, mobility of thin film transistors has not been increased sufficiently. The second object of the-invention is to obtain a higher mobility by optimizing conditions of laser annealing after solid phase growth. Additionally, in the technology combining solid phase growth and laser annealing, the crystal grain size of the polycrystalline silicon thin film is basically determined by solid phase growth. In order to obtain thin film transistors with a higher mobility, the grain size of the poly crystal must be increased more. This is also the second object of the invention. Furthermore, it is the second object of the invention to provide a silicon thin film having a still higher quality by employing a deposition method as a replacement for solid phase growth in combination with laser annealing.

Here is explained still another problem of conventional techniques. Heretofore, solid phase growth or annealing has been used as a method for making a polycrystalline semiconductor thin film to be used as the active layer of thin film transistors. In solid phase growth, although crystal grains contained in the polycrystalline semiconductor thin film grow to a size as large as about 1 $\mu$m, it contains a lot of crystal defects such as dislocation. Therefore, mobility of the thin film transistors is 100 $cm^2/V \cdot s$ or less in terms of the N channel. In contrast, in the case of crystallization by laser annealing, although crystal grains contain less crystal defects, since the crystal grain size can increase only to 200 through 300 nm, approximately, mobility of the thin film transistors also remain in the level equivalent to or lower than that by solid phase growth. There is a recently proposed method for repairing crystal defects by conducting laser annealing after solid phase growth, and this method can improve the mobility to approximately 130 $cm^2/V \cdot s$. However, this method uses laser annealing only for repairing crystal defects, and since the crystal grain size of the polycrystalline semiconductor thin film is determined by solid phase growth in the preceding step, further increase of the crystal grain size cannot be expected. In order to obtain thin film transistors whose mobility exceeds 300 $cm^2/V \cdot s$, more increase of the crystal grain size is indispensable, and attainment of this requirement is the third object of the invention.

DISCLOSURE OF INVENTION

To accomplish the first object of the invention, a method for manufacturing a thin film semiconductor device according to the invention basically includes a deposition step for making a non-single-crystalline semiconductor thin film on a surface of an insulating substrate, an annealing step for irradiating laser light to once heat and melt the non-single-crystalline semiconductor thin film and then changing it into a poly crystal in its cooling process, and a processing step for integrally forming thin film transistors using the semiconductor thin film of the polycrystal as the active layer. As a particular feature, in the annealing step, laser light having the pulse width of 50 ns or more is irradiated onto the semiconductor thin film by using an excimer laser source. In the annealing step, preferably after the laser light is shaped to have a rectangular cross section whose each side is not shorter than a predetermined length (for example 10 mm), the surface of the semiconductor thin film is irradiated sequentially by moving the laser light step by step so that the sides of the rectangular cross section partly overlap. In this case, frequency of irradiation of the laser light per each stepping movement is selected so that the frequency of overlapping irradiation of the laser light onto the same part of the surface of the semiconductor thin film is a predetermined number.

According to the invention, for making thin transistors using the polycrystalline semiconductor of polycrystalline silicon, for example, as the active layer on the insulating substrate in a low-temperature process, amorphous silicon is first made on the insulating substrate by low-pressure chemical vapor deposition (LP-CVD), plasma CVD or sputtering. After that, by using an excimer laser light source, the laser light is irradiated onto the semiconductor thin film to change the amorphous silicon into polycrystalline silicon. In some cases, polycrystalline silicon having a relatively small grain size may be changed into polycrystalline silicon having a relatively large grain size by irradiation of the laser light. To generalize them altogether, amorphous silicon and polycrystalline silicon having a small grain size are called non-single-crystalline silicon, and in this embodiment, non-single-crystalline silicon is changed into polycrystalline silicon by irradiation of the laser light. Unlike the conventional techniques, in the present invention, laser light released from an excimer laser source having the pulse width of 50 ns or more is shaped into a rectangle by an appropriate optical system, and it is irradiated onto the semiconductor thin film step by step. For example, the laser light is shaped by an optical system to have a rectangular cross section of 10 mm×10 mm or larger in terms of the irradiated area of the semiconductor thin film. In this embodiment, laser light is irradiated while moving it step by step to partly overlap it so that the same position is irradiated by the laser light at least two times at least in a part of the entire area of the insulating substrate. By employing this mode of irradiation, it is possible to make a polycrystalline semiconductor thin film having a uniform, large grain size sufficiently acceptable as the active layer of high-mobility, high-performance thin film transistors. More specifically, polycrystalline silicon having the grain size exceeding 300 to 1000 nm can be made uniformly throughout the entire surface of the substrate.

To attain the second object of the invention, the following means is employed. That is, the invention relates to a method for manufacturing a semiconductor transistor, which forms on an insulating substrate a multi-layered structure basically including a semiconductor thin film, gate insulating film stacked on one surface of the semiconductor thin film and gate electrode stacked on the semiconductor thin film via the gate insulating film. According to one aspect of the invention, the thin film transistor is manufactured in the following process. First conducted is a forming step to form on the insulating substrate the semiconductor thin film containing polycrystalline grains. More specifically, a deposition step is conducted to stack on the insulating substrate an amorphous semiconductor thin film or a polycrystalline semiconductor thin film made up of crystal grains of a relatively small grain size. Next conducted is a solid phase growth step to grow crystal grains with a relatively small grain size in solid phase by annealing the semiconductor thin film. Alternatively, a semiconductor thin film containing polycrystalline grains may be stacked directly on the insulating substrate by chemical vapor deposition using a catalyst. After that, a laser annealing step is conducted to remove residual defects in the crystal grains by using laser light in the form of pulses having the emission time of 100 ns or more and irradiating the semiconductor thin film with an energy not inviting destruction of crystal grains of large sizes. Preferably, in the laser annealing step, laser light is irradiated onto the semiconductor thin film with the energy of 500 to 600 J/cm$^2$.

According to another aspect of the invention, the thin film transistor is manufactured in the following process. First conducted is a deposition step to stack on the insulating substrate an amorphous semiconductor thin film or a polycrystalline semiconductor thin film made up of crystal grains with a relatively small grain size. There follows the solid phase growth step in which the semiconductor thin film is annealed to grow crystal grains with a larger grain size in solid phase. Next comes the laser annealing step in which by using laser light in the form of pulses, energy as moderate as not causing destruction of large size crystal grains is irradiated onto the semiconductor thin film to remove residual defects in the crystal grains. After that, an additional solid phase growth step is conducted to anneal the semiconductor thin film again and grow crystal grains with a still larger grain size in solid phase. Preferably, after the additional solid phase growth step, moderate energy not inviting destruction of large-size crystal grains is irradiated again onto the semiconductor thin film by using laser light in the form of pulses, and an additional laser annealing step is conducted to remove defects produced in the additional solid phase growth step.

This aspect of the invention involves a method for making a semiconductor thin film. That is, the method for making a semiconductor thin film according to the invention comprises a forming method for forming a semiconductor thin film on an insulating substrate at a temperature not higher than 400° C. by chemical vapor deposition using a catalyst, and a laser annealing step for improving the quality of the semiconductor thin film by irradiating laser light in the form of pulses having emission time not shorter than 100 nm on the insulating substrate. More specifically, in the forming step, a polycrystalline semiconductor thin film containing crystal grains is formed by chemical vapor deposition using a catalyst, and in the laser annealing step, laser light with an energy not inviting destruction of the crystal grains is irradiated to remove defects existing in the crystal grains and thereby improve the quality of the semiconductor thin film. Preferably, the forming step forms a semiconductor thin film containing hydrogen by 1% or less and having a thickness not thicker than 50 nm is formed on the insulating substrate by chemical vapor deposition using a catalyst. Preferably, this forming step forms the semiconductor thin film in a reaction chamber which can be evacuated, and the laser annealing step irradiates laser light on the insulating substrate without breaking the evacuated condition of the reaction chamber. If so desired, the forming step and the laser annealing step are repeated alternately until the semiconductor thin film grows to a predetermined thickness.

According to one aspect of the invention, the polycrystalline semiconductor thin film having large-size crystal grains is obtained by solid phase growth using annealing or chemical vapor deposition using a catalyst. After that, laser annealing is conducted to remove residual defects in the crystal grains. By increasing the grain size by solid phase growth, etc. and removal of defects by laser annealing, mobility of the thin film transistors can be increased. In this case, when laser annealing is conducted by using the pulse-mode laser light having emission time (relaxation time) not shorter than 100 ns, crystal defects can be removed efficiently. Therefore, removal of defects can be improved significantly by using laser pulses having a longer emission time than conventional ones. To maintain the crystal grain size obtained in the solid phase growth, it is important that the energy applied to the semiconductor thin film in the laser annealing step be controlled in a level not inviting destruction of the large-size crystal grains (for example, 500 through 600 cm$^2$/V·s). In the laser annealing, by removing residual crystal defects without producing new crystal defects, a high mobility can be attained. In the other aspect of the invention, after the laser annealing step, crystal grains with a still larger grain size are grown in solid phase by annealing the semiconductor thin film again. As a result, a further improvement of the mobility can be attained. By conducting laser annealing after the first solid phase growth, crystal defects decrease, and a stress in the thin film is alleviated. By conducting the second solid phase growth in this status, the crystal grain size is increased efficiently. In the other aspect of the invention, the semiconductor thin film suitable as the active layer of thin film transistors is made by combining chemical vapor deposition using a catalyst (catalytic CVD) and laser annealing. Catalyst CVD is capable of forming the polycrystalline semiconductor thin film of polycrystalline silicon, for example, at a low temperature not higher than 400° C. By processing this semiconductor thin film by laser annealing, defects contained in the crystal grains can be removed. Since catalytic CVD and laser annealing are low-temperature processes, it is possible to make thin film transistors in a low-temperature process while maintaining the property of the thin film transistors.

Furthermore, to attain the third object of the invention, the following means is employed. That is, there is provided a method for manufacturing a thin film transistor, which forms on an insulating substrate a multi-layered structure including a semiconductor thin film, a gate insulating film stacked on one surface of the semiconductor thin film, and a gate electrode stacked on the semiconductor thin film via the gate insulating film, and the method comprises a forming step for forming on the insulating substrate a semiconductor thin film containing polycrystalline grains, and a laser annealing step for irradiating laser light in the mode of pulses having emission time not shorter than 50 ns and thereby removing residual defects in the crystal grains to increase the size of the crystal grains. Preferably, in the laser annealing step, irradiation of the pulse-mode laser light is repeated a number of times necessary for the crystal grains to grow to a predetermined size. In the laser annealing step, the pulse-mode laser light is repeatedly irradiated in a cycle not shorter than ⅕ Hz. Still in the laser annealing step, the laser light is irradiated onto the semiconductor thin film under the energy density of 400 through 600 cm²/V·s. Further, the laser annealing step uses pulse-mode laser light having emission time not shorter than 100 ns. Furthermore, the laser annealing step irradiates laser light having an irradiation area not smaller than 5 cm² onto the semiconductor thin film. The forming step includes a deposition step for stacking an amorphous semiconductor thin film or a polycrystalline thin film made of crystal grains with a relatively small grain size on an insulating substrate, and a solid phase growth step for annealing the semiconductor thin film to grow crystal grains with a larger grain size in solid phase. Alternatively, the forming step stacks a semiconductor thin film containing polycrystalline grains on the insulating substrate by chemical vapor deposition using a catalyst.

According to the invention, in the manufacturing process of a thin film transistor, the semiconductor thin film containing polycrystalline grains is formed on the insulating substrate by solid phase growth or catalytic chemical vapor deposition. After that, by repeatedly irradiating pulse-mode laser light, residual defects in the crystal grains are remedied, and the crystal grains are enlarged. As a result, a high-mobility semiconductor thin film can be obtained. Especially when the number of times of irradiation of pulse-mode laser light is determined adequately, a polycrystalline semiconductor thin film containing crystal grains with a predetermined size can be made.

BEST MODE FOR CARRYING OUT THE INVENTION

Figure 1:
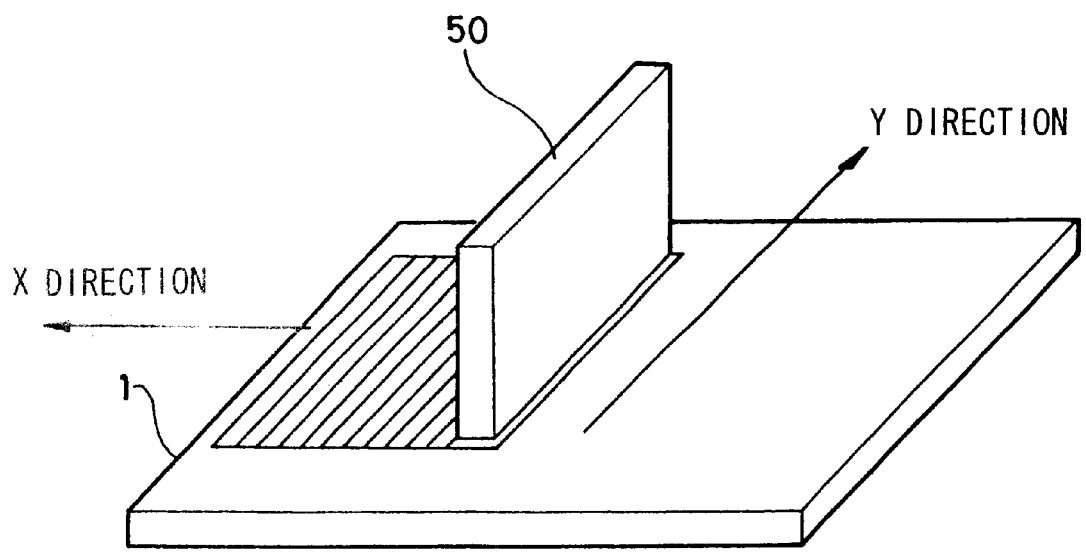
FIG. 1 is a schematic diagram showing a conventional laser annealing method.
Figure 2:
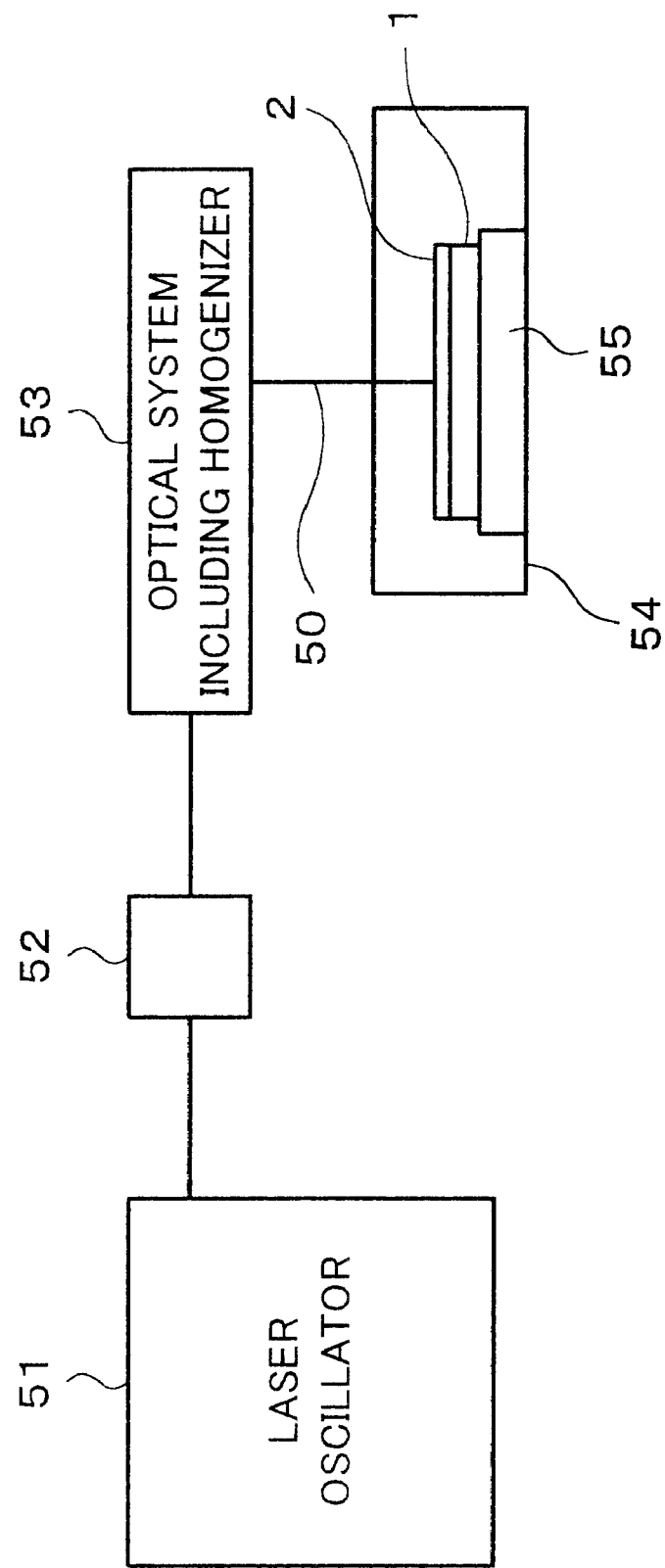
FIG. 2 is a schematic diagram showing a major part of a manufacturing process of a thin film semiconductor device according to the invention.

Embodiments of the invention are explained below in detail with reference to the drawings. FIG. 2 schematically illustrates a major part of a manufacturing process of a thin film semiconductor device, which is related to the first object of the invention. The present invention basically executes a deposition step for stacking a non-single-crystalline semiconductor thin film 2 on one surface of an insulating substrate 1, an annealing step for irradiating laser light 50 to once heating and melting the non-single crystalline semiconductor thin film 2 and thereafter changing it into a polycrystal in its cooling process, and a processing step for integrally forming a thin film transistor having the polycrystallized semiconductor thin film as its active layer.

FIG. 2 schematically illustrates the annealing step, among others. The laser annealing apparatus used in this annealing step has a laser oscillator 51, attenuator 52, optical system 53 including a homogenizer, chamber 54 and stage 55. The laser oscillator 51 includes an excimer laser source and intermittently emits laser light 50 having a pulse width not shorter than 50 ns. The optical system 53 including the homogenizer receives the laser light emitted from the laser oscillator 51 via the attenuator 52, then shapes it to have a rectangular cross section with each side being 10 mm or more, and irradiates it onto the semiconductor thin film 2. The insulating substrate 1 having formed the non-single-crystalline semiconductor thin film 2 is set on the stage 55 inside the chamber 54. The stage 55 is movable in XY directions. In this embodiment, the laser light 50 is moved step by step relative to the semiconductor thin film 2 so that the sides of the rectangular cross section partly overlap, and are sequentially irradiated onto the surface. Preferably, the number of times of laser light irradiation per each stepping movement is previously set so that any particular part of the surface of the semiconductor thin film 2 is irradiated by a predetermined number of shots of laser light 50. The attenuator 52 is used to adjust the energy of the laser light emitted from the laser oscillator 51. The optical system 53 shapes the laser light to have a rectangular cross section and also adjusts it so that the energy be distributed uniformly over the entire rectangular cross section. The laser anneal apparatus used in the invention has a relatively large output power and can output laser pulses having an emission time not shorter than 50 ns. In contrast, conventional laser anneal apparatuses output laser pulses with an emission time of 20 through 50 ns, and their powers are insufficient for removal of crystal defects.

Figure 3A:
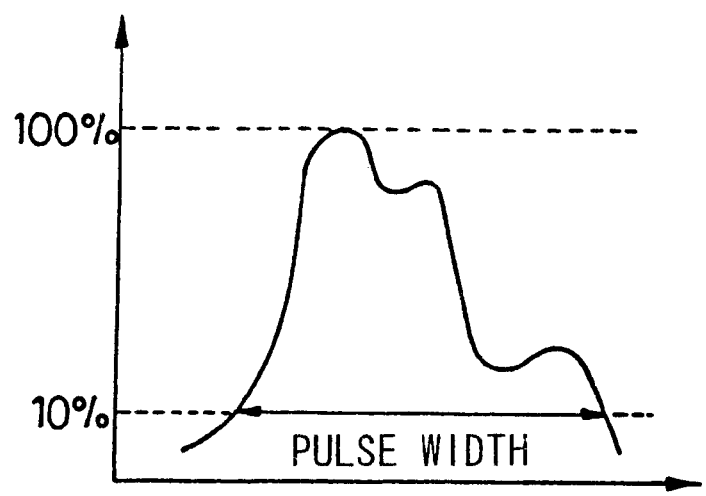
FIG. 3 contains graphs schematically showing the pulse width of laser light used in the manufacturing method of the thin film semiconductor device according to the invention.
Figure 3B:
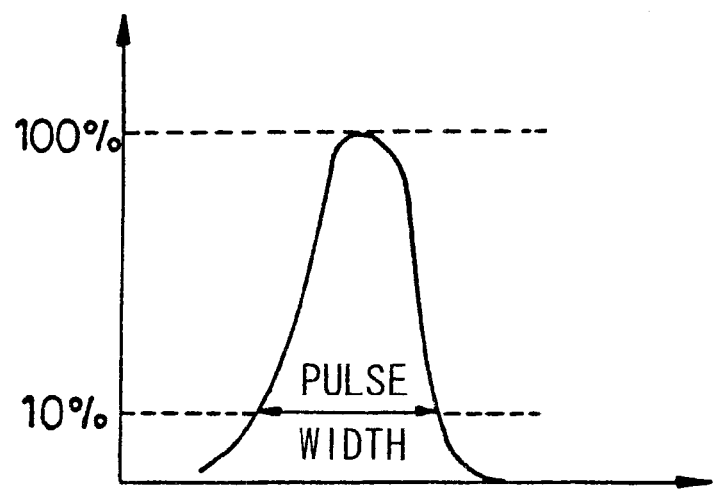

FIG. 3 schematically shows pulse widths of laser light. In this description, the width of the 10% level relative to the peak level of the laser light is defined as the pulse width. As shown in FIG. 3A, the pulse width of an excimer laser source used in conventional crystallization annealing is less than 50 ns. In contrast, the pulse width of the laser light emitted from the excimer laser source used in the embodiment exceeds 50 ns as shown in FIG. 3B, and it is typically around 200 ns. FIG. 3A and FIG. 3B show different pulse waveforms for the purpose of demonstrating that regardless of the pulse waveforms, the width of the 10% level relative to the peak level is measured. Essentially, therefore, no correlation exists between the pulse waveform and the pulse width. Therefore, a pulse waveform as shown in FIG. 3A is also acceptable if it has a pulse width beyond 50 ns.

Table 1 given below shows the performance of the laser anneal apparatus used in the annealing step.

TABLE 1

| Laser Anneal Apparatus | Pulse Width (ns) | Maximum Grain Size (nm) |
|---|---|---|
| A | 25 | 350 |
| B | 45 | 350 |
| C | 220 | 1500 |

The laser anneal apparatus A is a conventional apparatus having the pulse width of 25 ns, configured to shape laser light into a line beam with the width of 0.5 mm and irradiate it onto the semiconductor thin film while scanning the line beam in its width direction. Scanning by the line beam is conducted to make irradiated regions partly overlap so that any particular portion is irradiated 50 times. The maximum grain size of polycrystalline silicon obtained thereby was 350 nm. The laser anneal apparatus B is also a conventional apparatus having the pulse width of 45 ns. Here again, laser light was shaped into a line beam having the width of 0.5 mm, and irradiated onto the semiconductor thin film in the overlapping manner. The maximum grain size of the polycrystalline silicon semiconductor thin film obtained thereby is 350 nm. In contrast, the laser anneal apparatus C is that used in the present invention, and its pulse width is 220 ns. Laser light having the pulse width of 220 ns was shaped to make a 10 mm×10 mm rectangular cross section, and it was irradiated while being scanned in the XY directions so that the sides of the rectangle overlap. In each stepping movement, the laser light was irradiated in pulses repeating 10 times. The maximum grain size of the polycrystalline silicon semiconductor thin film obtained thereby reaches 1500 nm.

Table 2 demonstrates relations between the number of irradiation shots and the grain size in the laser anneal apparatus C. That is, it shows a result of experimental investigation of numbers of irradiation shots of laser light repeatedly irradiated under a constant energy onto a particular portion by using the laser anneal apparatus C and grain sizes obtained thereby. The grain size of polycrystalline silicon increases with the increase in number of irradiation shots, and becomes substantially constant after the number of irradiation shots reaches 10 shots. Even when the number of irradiation shots is increased to more than 10 shots, the crystal grain size does not change so much. That is, it comes in saturation.

TABLE 2

| Number of Shots | Grain Size (nm) |
|---|---|
| 1 | 140 |
| 2 | 180 |
| 4 | 350 |
| 5 | 470 |
| 10 | 1500 |
| 20 | 1400 |

Figure 4A:
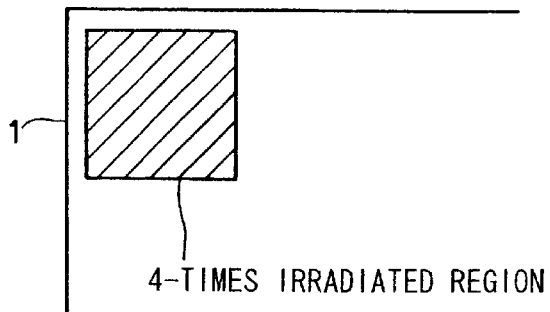
FIG. 4 contains plan views schematically showing an annealing step included in the manufacturing method of the thin film semiconductor device according to the invention.
Figure 4B:
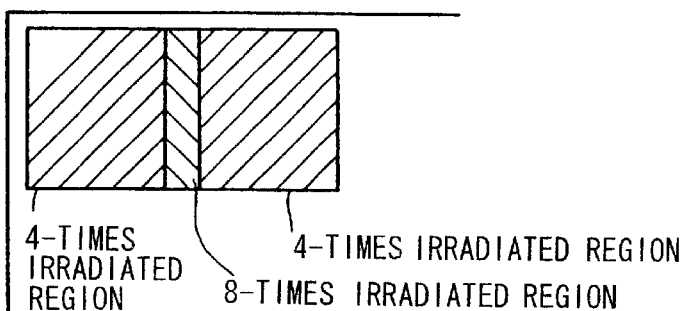
Figure 4C:
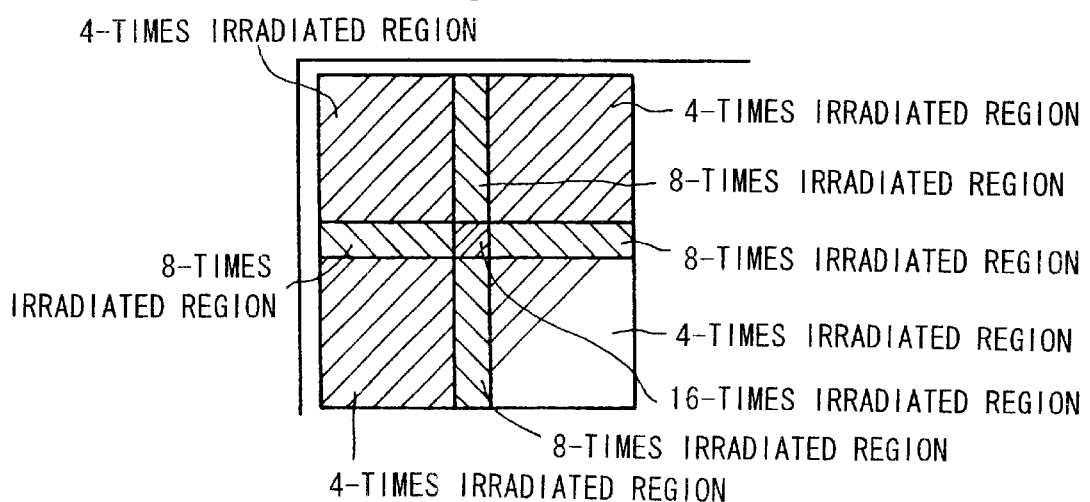

FIG. 4 schematically illustrates an embodiment in which by using the laser anneal apparatus C shown in Table 1 and Table 2, amorphous silicon stacked on a glass substrate was changed uniformly into polycrystalline silicon. In the case where a semiconductor thin film formed on an insulating substrate 1 larger than the cross-sectional area of the laser light is irradiated, it is necessary to scan the laser light relative to the insulating substrate 1. As shown in FIG. 4A, this example irradiates the laser light shaped into a rectangle with each side beyond 10 mm in its cross section being irradiated four times on each portion. After a certain portion of the insulating substrate 1 is irradiated by the laser light four times, they are relatively moved to a position where the next irradiated region slightly overlaps the former irradiated region along their sides, and the next region is also irradiated four times. As a result, the overlapping portion of consecutive rectangular cross-sectional areas becomes the region irradiated 8 times. Energy of the laser light irradiated onto a certain portion may be constant in all of four shots, or may be changed appropriately among these four shots depending under certain conditions. Although explanation has been made on the example in which the stage supporting the insulating substrate 1 does not move during four shots of irradiation, the stage may be moved after each shot of irradiation or may be moved continuously throughout the irradiation. This manner of irradiation results in making regions irradiated 8 times as shown in FIG. 4B and regions irradiated 16 times as shown in FIG. 4C due to the overlapping between consecutive shots. In this case, as apparent from reference to Table 2, polycrystalline silicon of grain sizes from 35 nm to 1500 nm can be obtained throughout the area of the insulating substrate 1.

Demands for uniformity all over the area of thin film transistors used in an active matrix display device are different depending upon the specification of the display device and built-in circuit arrangements thereof. In order to fabricate a high-performance active matrix display device having the need for polycrystalline silicon with more uniform and larger grain sizes, it is sufficient to irradiate the laser light 10 times on each portion. In this manner, polycrystalline silicon with very uniform grain sizes around 1500 nm can be made throughout the entire surface of the glass substrate.

Figure 5A:
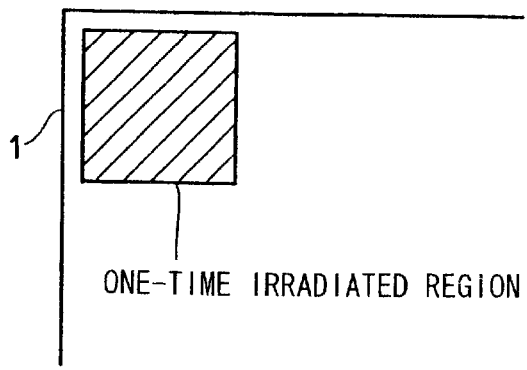
FIG. 5 contains plan views also schematically showing the annealing step.
Figure 5B:
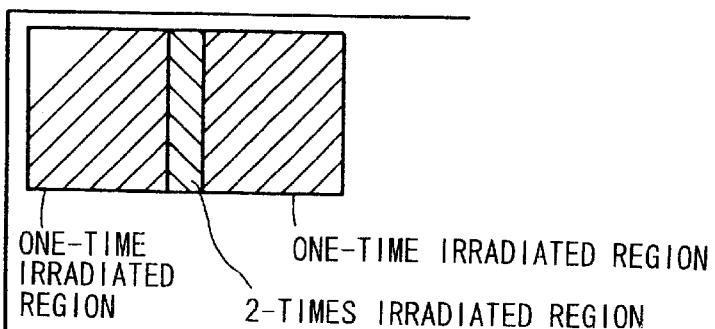
Figure 5C:
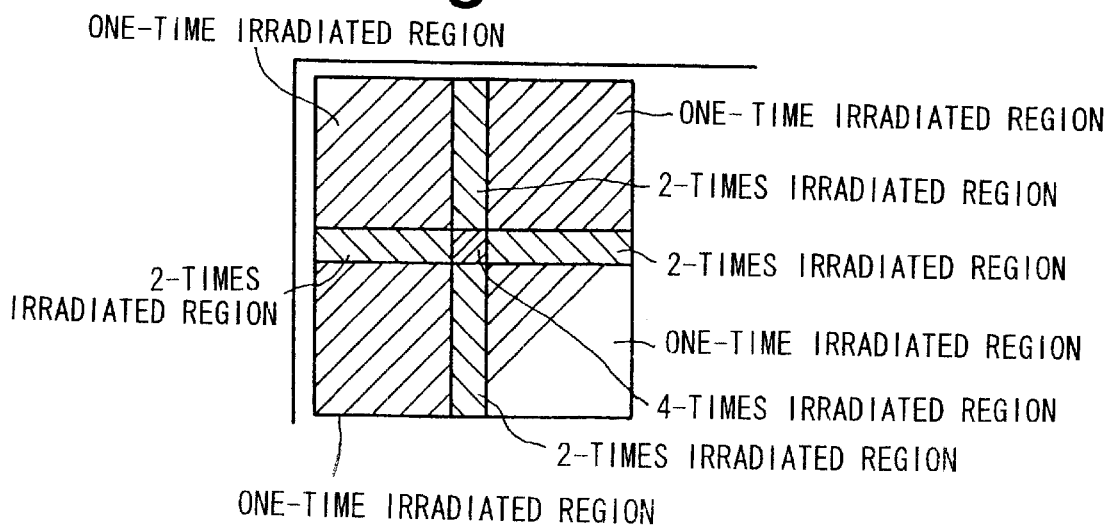

In a display device not required to be so high in quality, the irradiation method shown in FIG. 5 may be employed. In this case, there are produced, in the area of the glass substrate, portions irradiated only once as shown in FIG. 5A, portions irradiated twice as shown in FIG. 5B and portions irradiated four times as shown in FIG. 5C, and variety in grain size of the polycrystalline silicon is 140 through 350 nm with reference to Table 2. As explained above, depending on the specification of the display device and built in circuit arrangements thereof, thin film transistors sufficiently acceptable for use in active matrix display devices even with this level of variety in grain size can be made.

FIG. 6 contains process diagrams showing an embodiment of the manufacturing method of a thin film semiconductor device according to the invention. Here is taken a method for manufacturing a thin film transistor having a bottom-gate structure. First as shown in FIG. 6A, Al, Ta, Mo, W, Cr, Cu or an alloy of any of them is deposited to a thickness of 100 through 200 nm on an insulating substrate made of glass, for example, and it is patterned into a gate electrode 5.

Figure 6A:
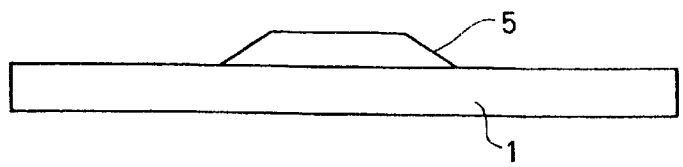
FIG. 6 contains process diagrams showing an embodiment of the manufacturing method of the thin film semiconductor device according to the invention.
Figure 6B:
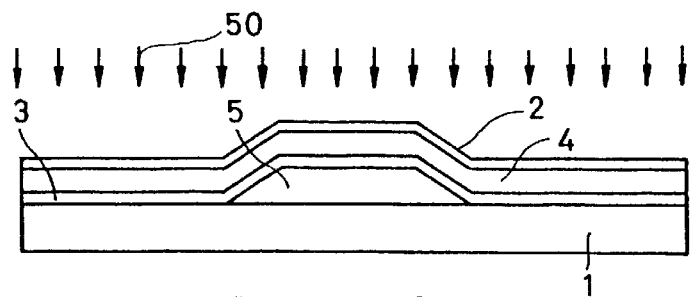

Next as shown in FIG. 6B, a gate insulating film is formed on the gate electrode 5. In this example, a two-layered structure of gate nitride film 3 ($SiN_x$)/gate oxide film 4 ($SiO_2$) was used as the gate insulating film. The gate nitride film 3 was stacked by plasma enhanced CVD (PE-CVD) using a mixture of $SiH_4$ gas and $NH_3$ gas as the source material gas. Normal pressure CVD or Reduced pressure CVD may be also used instead of PE-CVD. In this embodiment, the gate nitride film was stacked to the thickness of 50 nm. Subsequently to the stacking of the gate nitride film 3, the gate oxide film 4 is stacked up to a thickness around 200 nm. Furthermore, a semiconductor thin film 2 made of amorphous silicon was continuously stacked on the gate oxide film 4 up to a thickness around 30 through 80 nm. The two-layered gate insulating film and amorphous semiconductor thin film 2 were stacked consecutively without breaking the vacuum system of the deposition chamber. When plasma CVD is used for the above deposition, annealing is conducted in a nitrogen atmosphere at 400 through 450° C. for about one hour to remove hydrogen contained in the amorphous semiconductor thin film 2. So-called dehydrogenation annealing is conducted. After that, laser light 50 is irradiated to crystallize the amorphous semiconductor thin film 2. Usable as the laser light 50 is an excimer laser beam. So-called laser annealing is a powerful means for crystallizing semiconductor thin films at process temperatures not higher than 600° C. In this embodiment, laser light 50, which is excited in mode of pulses and shaped into a rectangular geometry, is irradiated onto the amorphous semiconductor thin film 2 to crystallize it. Pulse width of the laser light 50 is beyond 50 ns, and the size of its rectangular cross section exceeds 100 mm×10 mm. For example, the pulse width is chosen to 220 ns, and the rectangular cross section is chosen to 30 mm×70 mm.

Figure 6C:
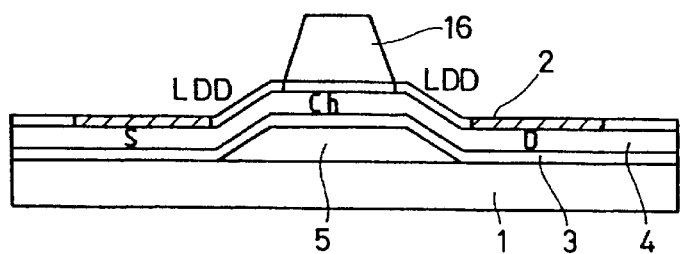

As shown in FIG. 6C, $SiO_2$ is stacked on the polycrystalline semiconductor thin film 2 already crystallized in the preceding step up to a thickness around 100 through 300 nm by plasma CVD, for example. This $SiO_2$ is patterned into a predetermined configuration to form an etching stopper film 16. In this case, the etching stopper film 16 is patterned to align with the gate electrode 5 by using a back exposure technique. The portion of the polycrystalline semiconductor thin film 2 located right under the etching stopper film 16 is protected as a channel region Ch. After that, using the etching stopper film 16 as a mask, an impurity (for example, $P^+$ ions) is injected into the semiconductor thin film 2 by ion doping to form an LDD region. Dose amount used here is, for example, $6 \times 10^{12}$ through $5 \times 10^{13}/cm^2$. Further, after a photo resist is coated and patterned to cover the stopper film 16 and LDD regions at opposite sides thereof, an impurity (for example, $P^+$ ions) is injected in a high concentration by using the photo resist as a mask to form the source region S and the drain region D. For injection of the impurity, ion doping may be used, for example. This is a method for injecting the impurity under electric field acceleration without conducting mass separation. In this example, the source region S and the drain region D were made by injecting the impurity by the dose amount around $1 \times 10^{15}/cm^2$. Although not shown, if a p-channel thin film transistor is to be made, ion doping may be conducted with the dose amount around $1 \times 10^{15}/cm^2$ by changing the impurity from $P^+$ ions to $B^+$ ions after covering the region of the n-channel thin film transistor with a photo resist.

Subsequently, the impurity injected into the polycrystalline semiconductor thin film 2 is activated. Here again, laser activation annealing using an excimer laser source is conducted. That is, they are irradiated onto the glass substrate 1 and activate the impurity injected into the polycrystalline semiconductor thin film 2.

Figure 6D:
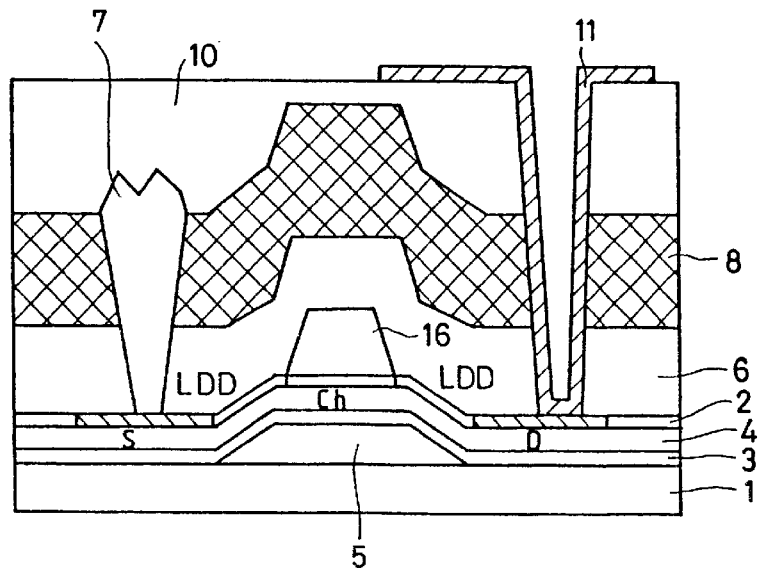

Finally, as shown in FIG. 6D, approximately 200 nm thick $SiO^2$ is stacked as an inter-layer insulating film 6. After the stacking of the inter-layer insulating film 6, $SiN_x$ is stacked to a thickness of about 200 through 400 nm by plasma CVD as a passivation film (cap film) 8. In this stage, annealing is conducted in a nitrogen gas atmosphere, forming gas atmosphere or vacuum at about 350° C. for one hour to disperse hydrogen atoms contained in the inter-layer insulating film 6 into the semiconductor thin film 2. Thereafter, a contact hole is opened, Mo, Al, or the like, is deposited to a thickness of 200 through 200 nm by sputtering, and it is patterned into a predetermined configuration to form a wiring electrode 7. Further, a smoothing layer 10 of acrylic resin, for example, is coated up to around 1 μm, and a contact hole is opened. After a transparent conductive film of ITO or IXO is made on the smoothing layer 10 by sputtering, it is patterned into a predetermined configuration to form a pixel electrode 11.

Figure 7:
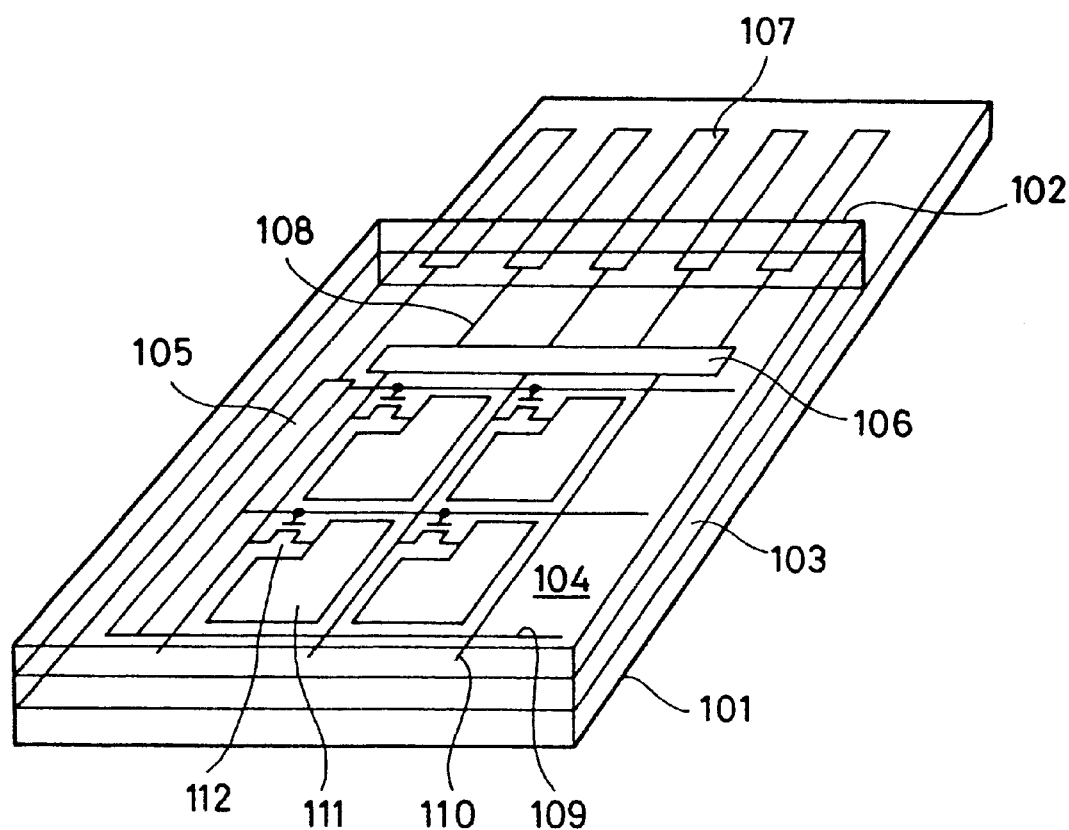
FIG. 7 is a schematic perspective view showing an active matrix display device using the thin film semiconductor device made by the method shown in FIG. 6.

Next explained is an example of active matrix display device using the thin film transistor made by the invention with reference to FIG. 7. As illustrated, the display device has a panel structure including a pair of insulating substrates 101, 102 and an electrooptic substance 103 held between them. Used as the electrooptic substance 103 is a liquid crystal material, for example. The lower insulating substrate has a pixel array portion 104 and a drive circuit portion integrated thereon. The drive circuit portion is divided into a vertical scanner 105 and a horizontal scanner 106. Further formed at the tope end of the peripheral portion of the insulating substrate 101 is a terminal portion 107 for external connection. The terminal portion 106 connects to the vertical scanner 105 and the horizontal scanner 106 via a wiring 108. Formed in the pixel array portion 104 are gate wirings 109 in line directions and signal wirings 110 in column directions. At the crossing of both these wirings, pixel electrodes 111 and thin film transistors 112 for driving them are formed. The gate electrode of each thin film transistor 112 is connected to the gate wiring 109, its drain region to corresponding one of the pixel electrodes 111, and its source region to corresponding one of the signal wirings 110. The gate wirings 109 connect to the vertical scanner 105 whereas the signal wirings 110 connect to the horizontal scanner 106. The thin film transistors 112 for switching and driving the pixel electrodes 111 and thin film transistors contained in the vertical scanner 105 and the horizontal scanner 106 are made according to the invention. Further, in addition to the vertical scanner and the horizontal scanner, a video driver and a timing generator can be also integrated in the insulating substrate 101.

FIG. 8 contains process diagrams showing a major part of the manufacturing method of a thin film transistor dealing with the second object of the invention. The thin film transistor has a multi-layered structure including a semiconductor thin film, gate insulating film stacked on one surface thereof, and gate electrode stacked on the semiconductor thin film via the gate insulating film, and it is formed on an insulating substrate. The thin film transistor is manufactured in the process shown below. First in the step shown in FIG. 8A, an amorphous semiconductor thin film or a polycrystalline semiconductor thin film 2 made of crystal grains having a relatively small grain size is stacked on the insulating substrate 1. For example, a semiconductor thin film 2 made of polycrystalline silicon is stacked to a thickness of 40 through 75 nm by LP-CVD. After that, $Si^+$ accelerated by an electric field is injected into the semiconductor thin film 2 to change it into an amorphous phase. Thereafter, the semiconductor thin film 2 is annealed to produce crystal grains with a relatively large grain size by solid phase growth. For example, by annealing it at 600° C. for 12 hours, crystal grains grow to grain sizes of about 1000 through 2000 nm. Then the process moves to the step shown in FIG. 8B in which, by using pulse-mode laser light having an emission time not shorter than 100 ns, an energy not inviting destruction of large size crystal grains is irradiated onto the semiconductor thin film 2 to remove residual defects in the crystal gains. More specifically, by using an excimer laser source having an emission time (relaxation time) of 200 ns and irradiating an energy in the level of 500 through 600 mJ/cm$^2$, crystal defects are removed. In this case, it is important to conduct excimer laser annealing (ELA) under the conditions in which the crystal obtained by solid phase growth does not melt completely. After that, the process moves to the step shown in FIG. 8C in which the semiconductor thin film 2 is patterned to meet the device region. The semiconductor thin film 2 patterned into the form of an island is covered by a gate insulating film 3. Then the process moves to the step shown in FIG. 8D and makes the gate electrode 5 on the gate insulating film 3. By injecting an impurity into the semiconductor thin film 2 in self alignment by using the gate electrode 5 as a mask, the thin film transistor having a top-gate structure is obtained. Needless to say, the invention is applicable not only to thin film transistors having a top-gate structure but also to thin film transistors having a bottom-gate structure.

Figure 8A:
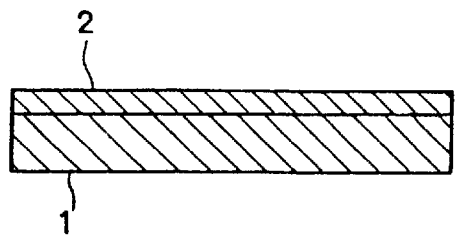
FIG. 8 contains process diagrams showing a major part of a manufacturing process of a thin film transistor according to the invention.
Figure 8B:
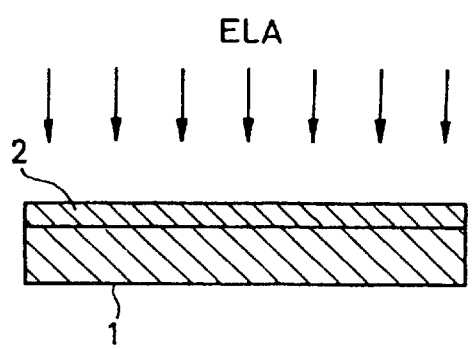
Figure 8C:
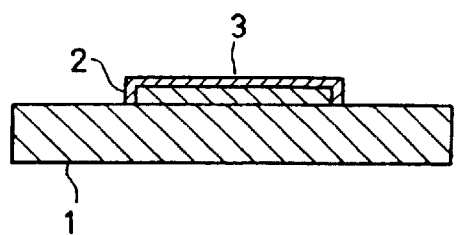
Figure 8D:
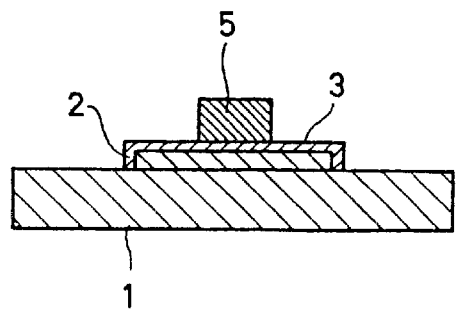

Depending on circumstances, an additional solid phase growth step may be inserted between the step shown in FIG. 8B and the step shown in FIG. 8C. That is, it is also possible to anneal the semiconductor thin film 2 once again to grow still larger crystal grains by solid phase growth. By conducting the additional solid phase growth under the condition where dislocation or other crystal defects are decreased by ELA and the stress in the thin film is alleviated, the grain size can be increased further more. Preferably, after the additional solid phase growth step, by using pulse-mode laser light and irradiating an energy in the level not inviting destruction of large size crystal grains, defects produced in the additional solid phase growth step are removed. In the solid phase growth process, a lot of dislocation occurs in the crystal. It will become one of factors of a decrease of the mobility of the thin film transistor. By heating the semiconductor thin film for a short time (for example, 200 ns) by using excimer laser light, this dislocation can be removed. If the solid phase growth is conducted at the temperature of 600° C. for 12 hours, crystal grains grow beyond 1000 nm. After that, when laser annealing is conducted according to the invention, mobility of the thin film transistor increases. In contrast, if the mobility in the level of the conventional one is acceptable, conditions of the solid phase growth may be alleviated to shorten the time or lower the heating temperature. Energy of the laser annealing is preferably adjusted accordingly.

Figure 9:
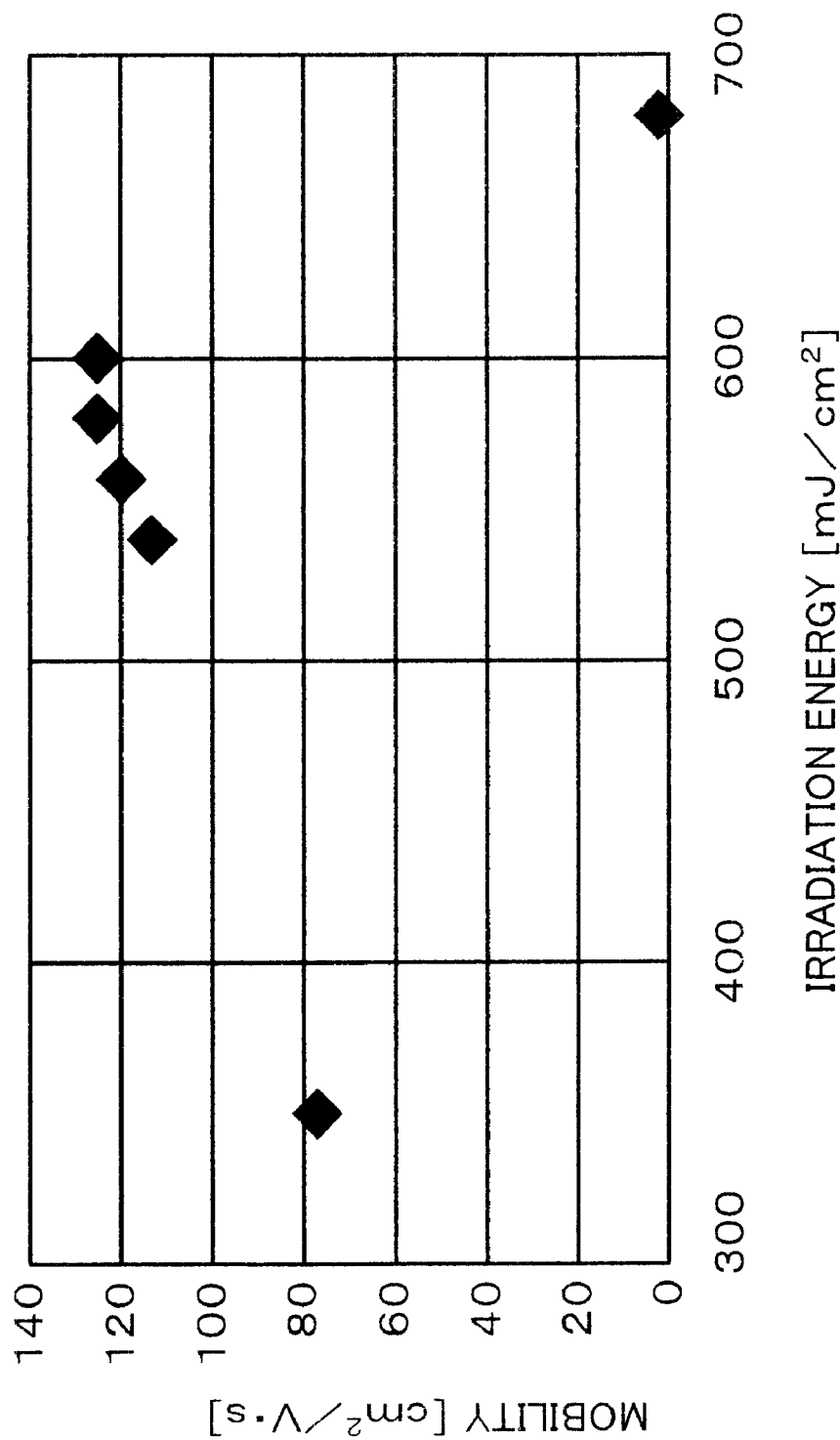
FIG. 9 is a graph showing relation between laser light irradiation energy and mobility of the thin film transistors.

FIG. 9 contains the measured data demonstrating the relation between the irradiation energy and mobility of the thin film transistor in the laser annealing step. As apparent from the graph, if laser annealing is conducted with an irradiation energy in the level of 500 through 600 mJ/cm$^2$, since crystal grains obtained by the solid phase growth are maintained as they were, mobility around 130 cm$^2$/V·s is obtained. When the irradiation energy exceeds 600 mJ/cm$^2$, since the crystal is molten by laser annealing, large grain sizes obtained by the solid phase growth cannot be maintained, and the mobility decreases below 10 cm$^2$/V·s. When the irradiation energy decreases below 400 mJ/cm$^2$, removal of crystal defects is insufficient, and the mobility does not become high.

Figure 10:
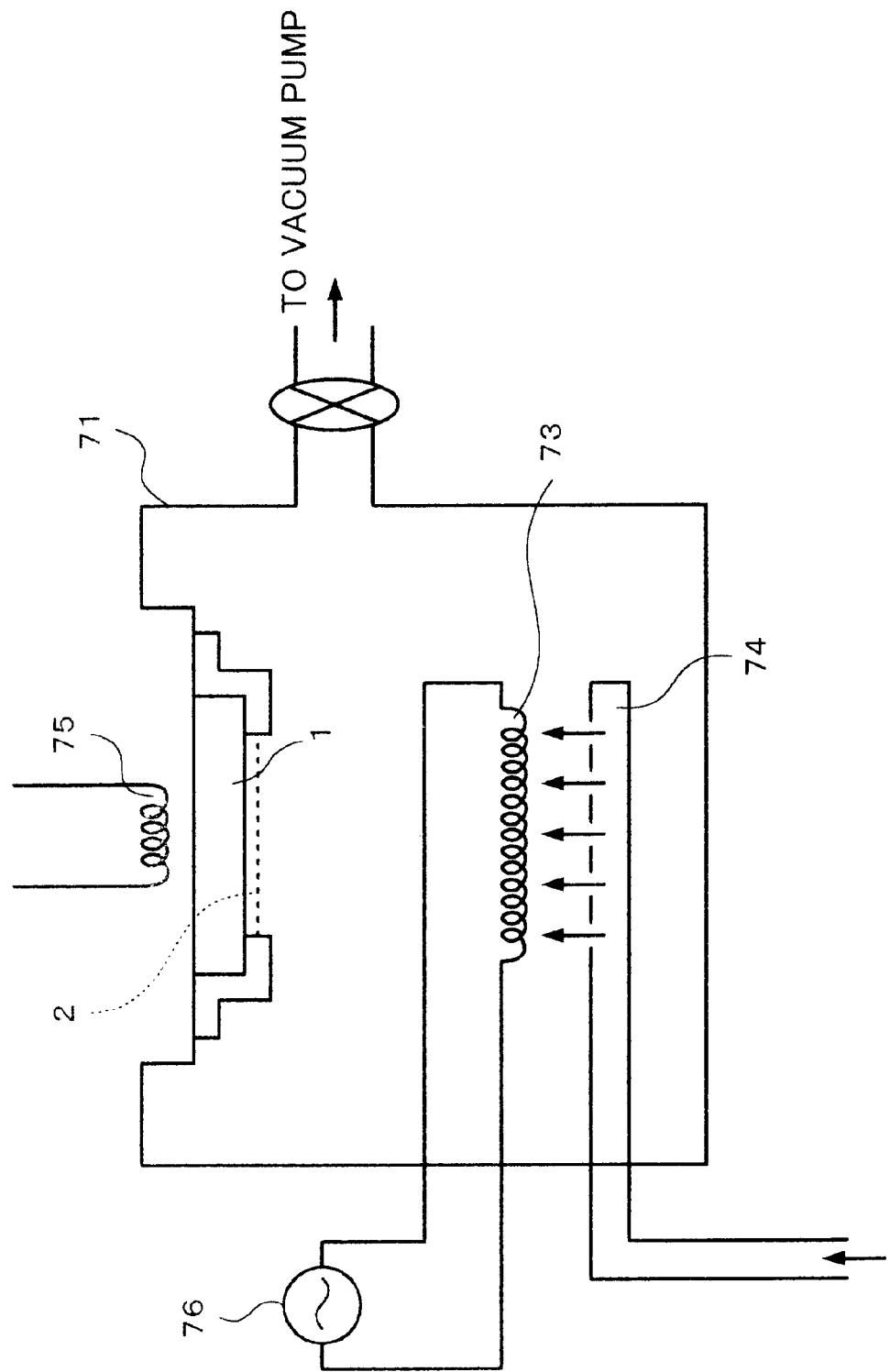
FIG. 10 is a schematic diagram illustrating a catalytic CVD apparatus used in the manufacturing process of the thin film transistor according to the invention.
Figure 11A:
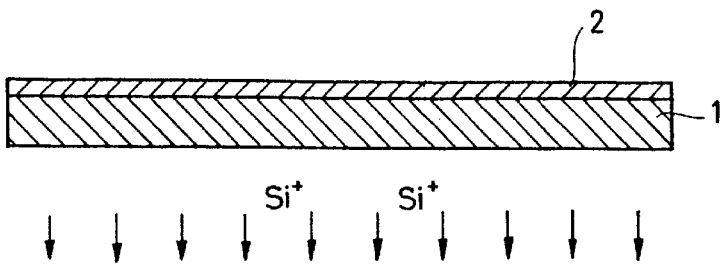
FIG. 11 contains process diagrams showing an embodiment of the manufacturing method of the thin film transistor according to the invention.
Figure 11B:
Figure 11C:
Figure 11D:
Figure 11E:
Figure 11F:
Figure 11G:
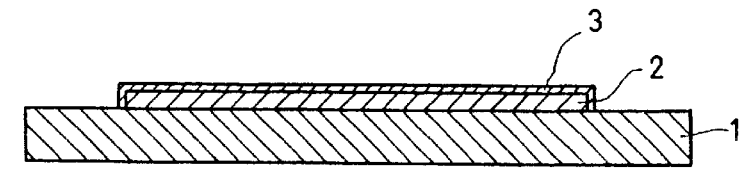

In the embodiment explained above, the semiconductor thin film is crystallized by solid phase growth. Instead, a polycrystalline semiconductor thin film can be stacked directly on the insulating substrate by so-called catalytic CVD. If the polycrystalline semiconductor thin film stacked by catalytic CVD is annealed, defects contained in the crystal grains can be removed. Catalytic CVD is a method which creates a semiconductor thin film of polycrystalline silicon while maintaining the temperature of the substrate itself at a low temperature without using plasma or optical excitation process, by blowing a source material gas onto a heated catalytic body located near an insulating substrate, thereby decomposing all or part of the source material gas by using catalytic cracking reaction between the catalyst and the source material gas, and then transporting the decomposed and stacked seed to the insulating substrate. FIG. 10 is an explanatory diagram of a creation method of a polycrystalline silicon semiconductor thin film by catalytic CVD. In FIG. 10, 71 refers to a reaction chamber. 73 is a catalytic body which may be a heater like tungsten, for example. 74 denotes a source material gas supply tube for supplying a source material gas. The source material gas is a mixed gas of a silane compound of a silane group element such as silane and disilane. 75 denotes a heater for heating the insulating substrate 1. 76 is a power supply source for supplying power to the catalytic body 73. In this structure, the insulating substrate 1 is heated at a low temperature around 500° C. by the heater 75. The source material gas is supplied to the source material gas supply tube 74. The source material gas contacts the catalytic body 73, and all or part of the silicon compound in the source material gas is decomposed by this contact to generate silicon (Si) seeds. Decomposed Si seeds, silicon compound which was not decomposed, and gas of other substances (hydrogen gas or the like) move onto the insulating substrate 1. Then, Si seeds stack on the surface of the insulating substrate 1 and form the semiconductor thin film 2 which is made up of polycrystalline silicon. Catalytic CVD is disclosed in Japanese Patent Laid-Open Publication No. hei 8-250438, for example.

Next referring to FIG. 11 through FIG. 13, explanation is made below of an embodiment of the thin film transistor manufacturing method according to the invention. This embodiment forms a thin film transistor of a top-gate structure in a high-temperature process in which the process temperature reaches 850° C. or higher. The invention, however, is not limited to it, and it is also applicable when making thin film transistors of a bottom-gate structure. First in the step shown in FIG. 11A, the semiconductor thin film 2 is formed on an insulating substrate 1 made of quartz. There was stacked polycrystalline silicon with a relatively small grain size to the thickness of 75 nm at a deposition temperature in the range of 600° C. through 700° C. by LP-CVD. The process moves to the step shown in FIG. 11B, and implants Si ions into the semiconductor thin film 2 by ion implantation to once change the polycrystalline silicon to amorphous phase. In this case, ion implantation was conducted twice by setting the acceleration energy of Si ions at 40 keV and 60 keV, respectively. The process goes to the step shown in FIG. 11C, and changes the semiconductor thin film 2 from amorphous silicon to polycrystalline silicon with a relatively large grain size by solid phase growth (SPG). Process conditions employed here are 600° C. and 12 hours for heating. The process then moved to the step shown in FIG. 11D in which by first ELA, defects contained in the crystal grains of the semiconductor thin film 2 were removed. As conditions used here, by using excimer laser light with the emission time (relaxation time) of 200 ns, an energy in the level of 500 to 600 mJ/cm$^2$ was irradiated. Then the process moved to the step shown in FIG. 11E, and enlarged the crystal grains contained in the semiconductor thin film 2 still further by conducting second SPG. The process next moved to the step shown in FIG. 11F, and crystal defects produced by second SPG were removed by second ELA. The process thereafter goes to the step shown in FIG. 11G, and the semiconductor thin film 2 is patterned to meet the geometry of individual thin film transistor regions. In this patterning step, photolithography and etching are used. Further, the gate insulating film 3 is formed on the surface of the semiconductor thin film 2. More specifically, the semiconductor thin film 2 is heated in an oxygen gas atmosphere at 1000° C. for 60 minutes. As a result, the surface of the semiconductor thin film 2 is thermally oxidized, and the gate insulating film 3 of silicon oxide is formed up to the thickness around 60 nm. As a result, thickness of the semiconductor thin film 2 is reduced to 45 nm.

Figure 12H:
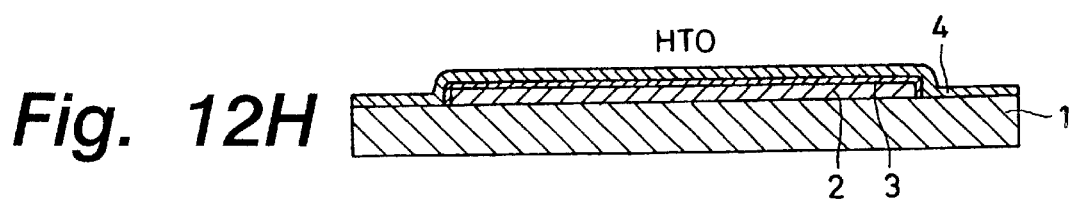
FIG. 12 contains process diagrams illustrating the embodiment of the manufacturing method of the thin film transistor according to the invention.
Figure 12I:
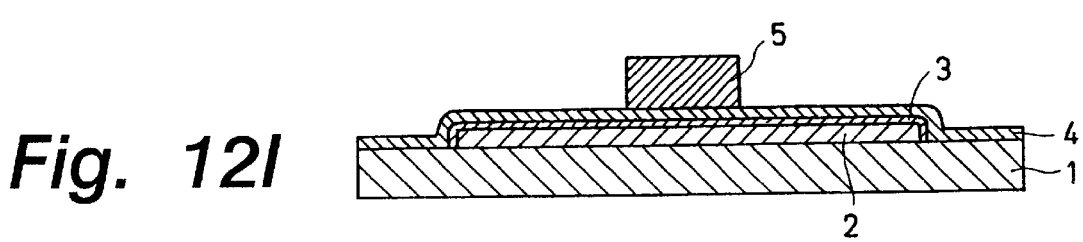
Figure 12J:
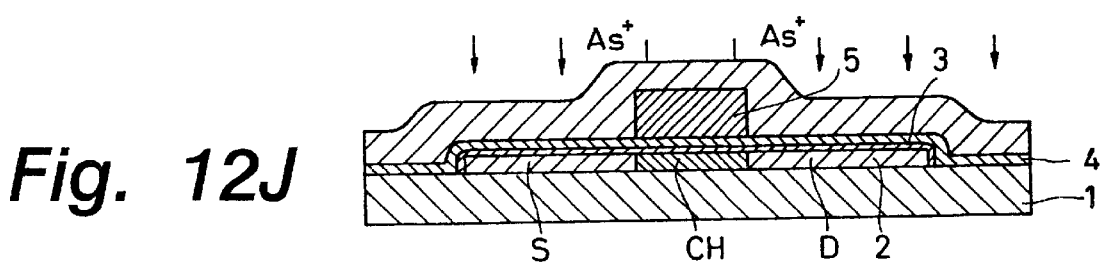
Figure 12K:
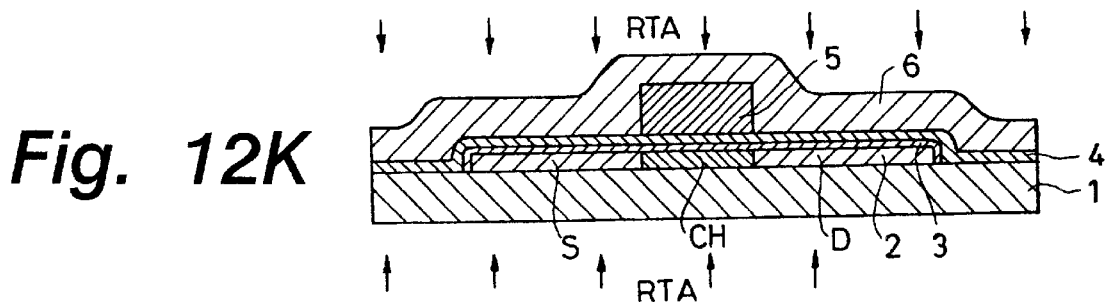

The process moves to the step shown in FIG. 12H, and a gate insulating film 4 is stacked on the gate insulating film 3. In this step, HTO (high temperature oxide) is stacked to 30 nm at the process temperature of 800° C. by CVD. It is additionally heated at 1000° C. for 10 minutes to closely pack the gate insulating film 4 of HTO. The process moves to the step shown in FIG. 12I, and the gate electrode 5 is formed on the gate insulating film 4. More specifically, after polycrystalline silicon is stacked to a thickness in the range of 350 through 450 nm, it is patterned into a predetermined configuration to form the gate electrode 5. Impurity phosphorus is diffused into the gate electrode 5 at the process temperature of 1000° C. to reduce its resistance. The process moves to the step shown in FIG. 12J in which by using the gate electrode 5 as a mask, impurity As is injected into the semiconductor thin film 2 by ion implantation, using the dose amount of $3\times10^{15}/cm^2$, for example. As a result, the source region S and the drain region D of the n-channel thin film transistor are formed. Immediately under the gate electrode 5, a channel region CH is maintained between the source region and the drain region D. If p-channel thin film transistors are to be made, impurity B may be injected into the semiconductor thin film 2 by ion implantation, using the dose amount of $1\times10^{15}/cm^2$, for example. The process moves to the step shown in FIG. 12K, and the gate electrode 5 is covered with a first inter-layer insulating film 6. In this example, PSG containing phosphorus by 4% was stacked to 600 nm at 400° C. by LP-CVD. After that, the semiconductor thin film 2 was heated by annealing or laser light irradiation to activate the impurity injected into the source region S and the drain region D.

Figure 13L:
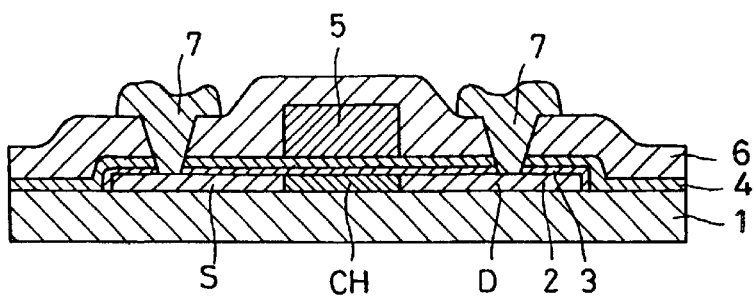
FIG. 13 contains process diagrams illustrating the embodiment of the manufacturing method of the thin film transistor according to the invention.
Figure 13M:
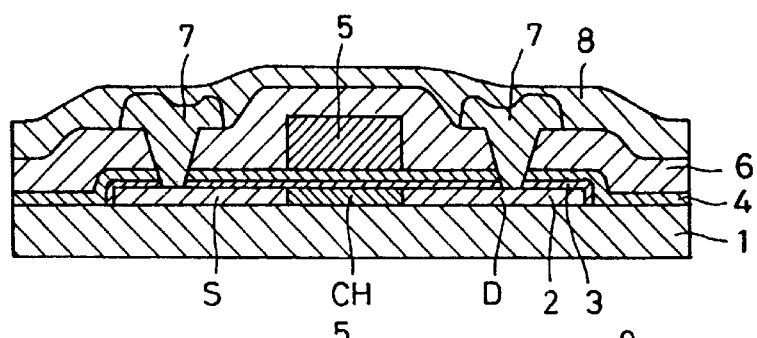
Figure 13N:
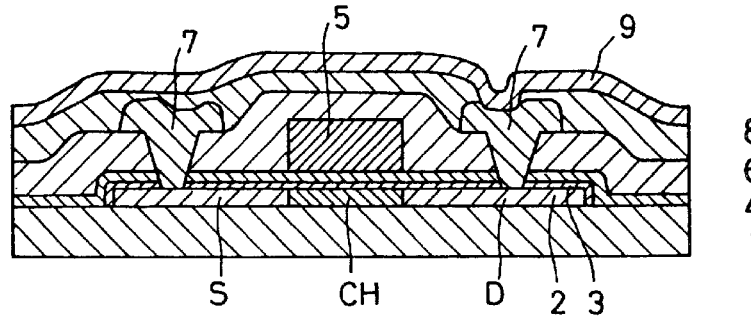
Figure 13O:
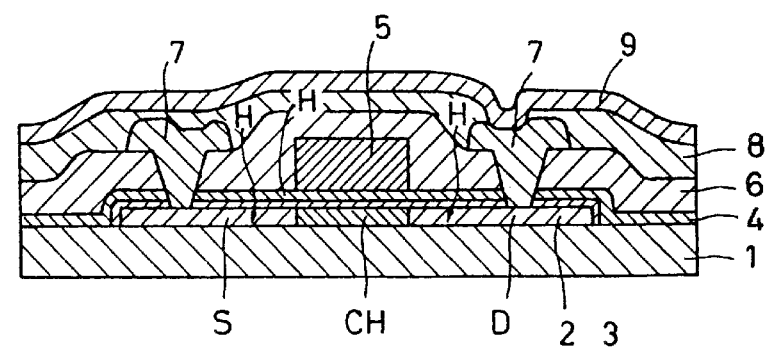

The process goes to the step shown in FIG. 13L, and contact holes are opened in the first inter-layer insulating film 6. After that, aluminum is stacked to the thickness of 600 nm by sputtering, and patterned into a predetermined configuration to form the wiring electrode 7. The process goes forth to the step shown in FIG. 13C, and PSG, for example, is stacked to form a second inter-layer insulating film 8 so as to cover the wiring electrode 7. Then the process moves to the step shown in FIG. 13N, and Ti is stacked on the second inter-layer insulating film 8 by sputtering to use it as a shade film 9. The process moves to the step shown in FIG. 13O in which heat of 400° C. is applied for 90 minutes in a forming gas atmosphere to diffuse hydrogen contained in the second inter-layer insulating film 8 into the semiconductor thin film 2. By so-called hydrogenation, the operation property of the thin film transistors are stabilized. The forming gas is nitrogen gas containing hydrogen by about 4%. Through these steps, thin film transistors having the top-gate structure are completed. In the case where the thin film transistors are used as pixel switching elements, after the shade film 9 is patterned into a predetermined configuration, pixel electrodes in the form of an ITO or other transparent conductive film are made in connection therewith.

Here is given an explanation on lowering the process temperature of the semiconductor thin film used as the active layer of the thin film transistors. Heretofore, plasma CVD has been employed for making a silicon or other semiconductor thin film at a low temperature not higher than 600° C. Plasma CVD is a method for introducing a source material gas of monosilane, for example, into a reaction chamber which can be evacuated, and a high frequency wave is applied to decompose the source material gas into hydrogen and silicon. Then, it stacks the decomposed silicon on an insulating substrate to form a semiconductor thin film. However, since monosilane does not fully decompose into hydrogen and silicon, hydrogen atoms partly connected to silicon atoms are taken into the film, and the hydrogen content in the semiconductor thin film is very high. Additionally, semiconductor thin films stacked by plasma CVD are usually amorphous. For changing amorphous silicon containing a lot of hydrogen atoms into a polycrystal, laser annealing is used as a part of a low-temperature process. However, since a large amount of hydrogen is contained in the film, when it is heated instantaneously by laser annealing, bumping of hydrogen, for example, occurs, and this remains as a problem in the manufacturing process. Additionally, since plasma CVD basically relies on a high frequency wave to decompose the source material gas, it is difficult to uniformly grow the semiconductor thin film over the entirety of the substrate having a large area.

Figure 14A:
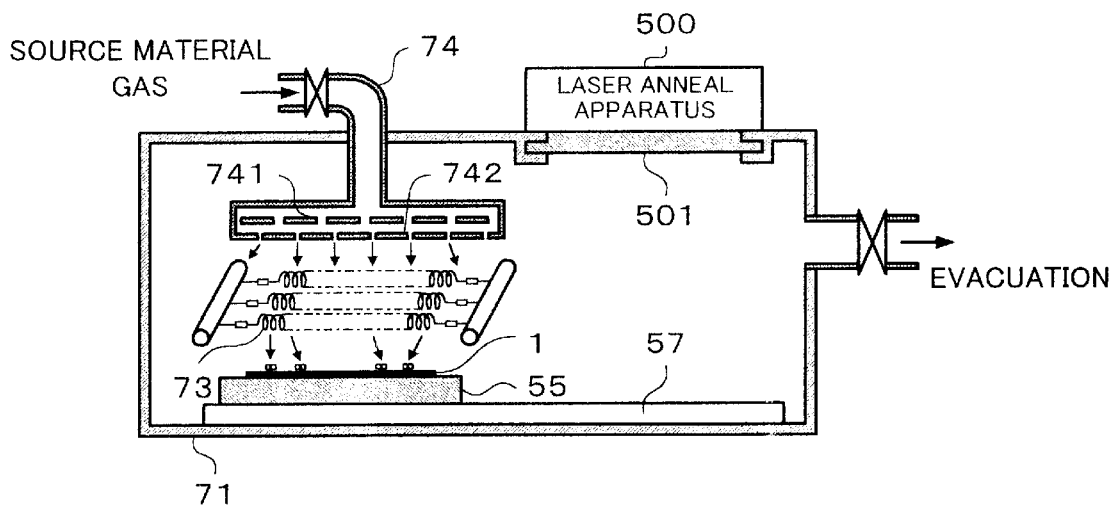
FIG. 14 contains schematic diagrams showing a method for forming a silicon film according to the invention.

Taking into account these drawbacks of plasma CVD, the invention combines catalytic CVD and laser annealing to enable fabrication of high-quality polycrystalline semiconductor thin films at low process temperatures. Explained below is a method for forming a semiconductor thin film according to the invention with reference to FIG. 14. As shown in FIG. 14A, the manufacturing apparatus used for this method has a structure incorporating the laser anneal apparatus shown in FIG. 2 and the catalytic CVD apparatus shown in FIG. 10. The invention, however, is not limited to this example, and separate catalytic CVD apparatus and laser anneal apparatus may be used sequentially to fabricate the semiconductor thin film. This manufacturing apparatus is assembled by using a reaction chamber 71 which can be evacuated, and includes a stage 55 and a drive mechanism 57 for driving it right and left; both of which are disposed on its bottom. The stage 55 supports thereon an insulating substrate 1 in the form of a glass plate, for example. In FIG. 14A, the stage 55 is located on the left side, and the semiconductor thin film is formed by catalytic CVD. At the top of the reaction chamber 71, a source material supply tube 74 is mounted. A flat-shaped nozzle 742 is attached to one end of the source material supply tube 74 inserted into the reaction chamber 71. The nozzle 742 has a gas dispersion plate 741 inside. A source material gas introduced through the supply pipe 74 is sprayed into the reaction chamber 71 by the nozzle 742. At the position 4 through 5 cm higher than the substrate 1 between the nozzle 742 and the stage 55, a catalytic body 73 is placed. The catalytic body 73 is a coil-shaped winding of tungsten wire, for example, and it is heated to 1600 through 1800° C., for example. The reaction chamber 71 is evacuated to form a pressure-reduced condition, and the insulating substrate 1 is heated to 300 through 400° C. by a heater contained in the stage 55. The source material gas sprayed out of the nozzle 742 catalytically decomposes at the surface of the catalytic body 73, and a film stacks on the insulating substrate 1. Used as the source material gas is a mixture of monosilane and hydrogen or monosilane as simple substance. In the catalytic CVD, since the source material gas itself is decomposed substantially completely by the catalytic body 73 at a very high temperature while maintaining the insulating substrate 1 at a low temperature not higher than 400° C., the stacked film has a dense polycrystalline property, and contains hydrogen as small as 1% or less.

Figure 14B:
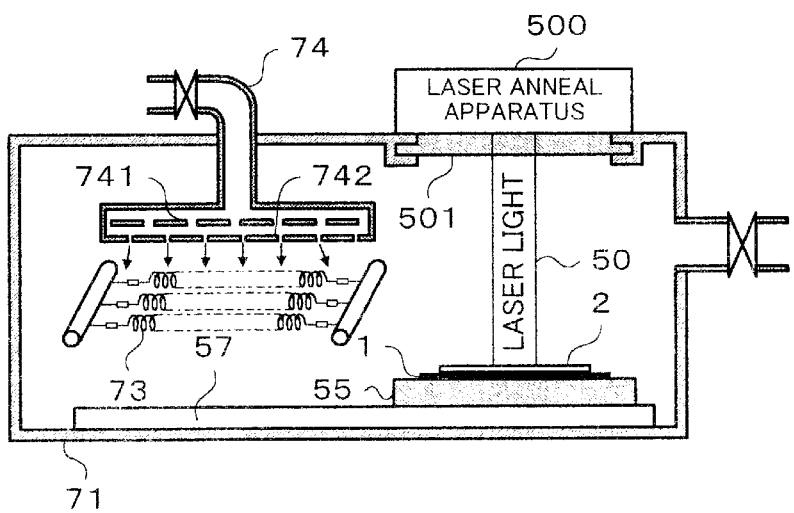

As shown in FIG. 14B, when deposition of the semiconductor thin film by catalytic CVD is finished, the stage 55 is moved from the left side to the right side in the reaction chamber 71 by a drive mechanism 57 while holding the insulating substrate 1 thereon. In this process, since the evacuated condition of the reaction chamber 71 is not broken, it is advantageous for efficiency of the manufacturing process. Special glass 501 transparent to ultraviolet rays is put on the top of the reaction chamber 71, and a laser anneal apparatus 500 as shown in FIG. 2 is mounted thereon. The laser anneal apparatus 500 includes an excimer laser source which intermittently emits laser light 50 whose pulse width is not shorter than 100 ns to improve the quality of the semiconductor thin film 2 of polycrystalline silicon formed on the insulating substrate 1. The laser light 50 is shaped to form a rectangular cross section, and it is irradiated step by step onto the semiconductor thin film 2. The stage 55 is movable in the XY directions. By driving the stage 55, laser light 50 is moved step by step relative to the semiconductor thin film 2 so that the rectangular cross section partly overlaps, and sequentially irradiates its surface. As a result, it is possible to remove defects contained in the crystal grains and obtain high-quality polycrystalline silicon. In this process, by irradiating the laser light 50 with an energy not inviting destruction of crystal grains, defects in the crystal grains can be removed, and the quality of the semiconductor thin film 2 can be improved. When the improved semiconductor thin film 2 is used as the active layer of thin film transistors, thickness of the semiconductor thin film 2 is preferably 50 nm or less.

Depending on circumstances, semiconductor thin films 2 can be stacked until reaching a desired thickness by alternately repeating catalytic CVD and laser annealing. For example, by stacking a semiconductor thin film 2 having a thickness around 10 nm in one catalytic CVD and repeating it five times, the semiconductor thin film 2 having the thickness of 50 nm can be formed. In this method, since semiconductor thin films are sequentially stacked over the surface of another already improved by laser annealing, good crystal grains grow on the improved base film as the core. Additionally, according to the invention, by combining chemical vapor deposition using a catalyst with laser annealing, it is possible to efficiently make high-quality semiconductor thin films in a low-temperature process.

Figure 15A:
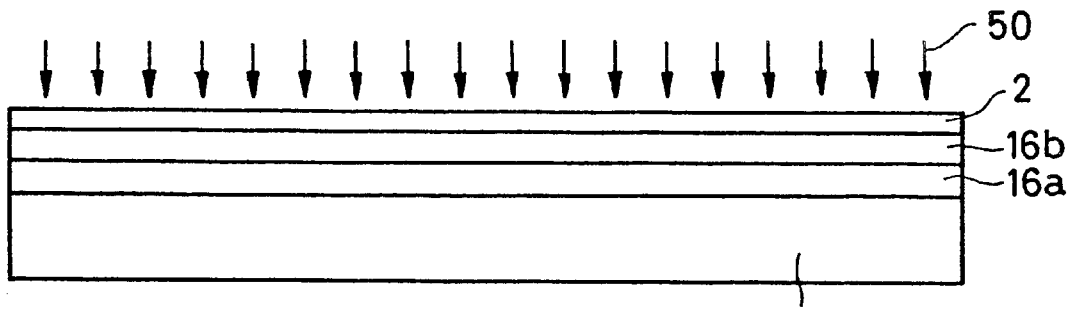
FIG. 15 additionally contains process diagrams showing another embodiment of the manufacturing method of the thin film transistor according to the invention.

With reference to FIG. 15, a thin film transistor manufacturing method dealing with the third object of the invention is explained below in detail. First as shown in FIG. 15A, two base films 16a and 16b to be used as a buffer layer are consecutively formed on the insulating substrate 1 by plasma CVD. The base film 16a as the first layer is made of $SiN_x$ and its thickness is 100 through 200 nm. The base film 16b as the second layer is made of $SiO_2$, and its thickness is also 100 nm through 200 nm. On the base film 16b of $SiO_2$, a semiconductor thin film 2 of polycrystalline silicon is formed to a thickness in the range of 40 through 100 nm by low pressure chemical vapor deposition (LP-CVD). Consecutively, $Si^+$ ions are injected into the semiconductor thin film 2 under acceleration by an electric field by an ion implantation apparatus, for example, to change the polycrystalline silicon to amorphous phase. Instead of the method for first stacking the polycrystalline silicon and then changing it to amorphous phase, it is possible to originally stack a semiconductor thin film 2 of amorphous silicon on the insulating substrate 1 by low pressure chemical vapor deposition (LP-CVD), plasma CVD or sputtering, for example. After that, solid phase growth is conducted by annealing the semiconductor thin film 2 of amorphous silicon at 630° C. for about 12 hours in a nitrogen atmosphere. In this process, the semiconductor thin film 2 is polycrystalline, and grain size of the polycrystalline silicon grows to about 1 μm. By using catalytic CVD instead of solid phase growth, the semiconductor thin film 2 containing polycrystalline grains may be formed directly by using the CVD apparatus shown in FIG. 10.

After that, using the laser anneal apparatus shown in FIG. 2, pulse-mode laser light 50 having an emission time not shorter than 50 ns is irradiated onto the semiconductor thin film 2 to remove residual defects from the crystal grains and further enlarge the crystal grains. This embodiment not only remedies crystal defects contained in the polycrystalline semiconductor thin film 2 by using the laser anneal apparatus having a large-power excimer laser source, but also increases the crystal grains still further, and therefore largely contributes to improvement of the mobility of thin film transistors. In the laser annealing step, irradiation of pulse-mode laser light 50 can be repeated over a number of times necessary for enlarging the crystal grains to a desired size. In the laser annealing step, pulse-mode laser light is irradiated cyclically with the period of ⅙ Hz for the purpose of shortening the throughput. The high-power laser anneal apparatus shown in FIG. 2 has the power of pulse-mode emission of the laser light with the period of ⅙ Hz or higher. In the laser annealing step, the laser light is irradiated onto the semiconductor thin film with the energy density of 400 through 600 mJ/cm². This range of energy density makes it realize remedy of crystal defects and enlargement of crystal grains. Although the laser anneal apparatus shown in FIG. 2 has a high output power capable of emitting pulse-mode laser light basically having the emission time of 50 ns or more, preferably by using pulse-mode laser light having an emission time not shorter than 100 ns, remedy of crystal defects and enlargement of crystal grains are done efficiently. This laser anneal apparatus has a large output power and can irradiate laser light having an irradiation area of 5 cm² or more onto the semiconductor thin film 2 each time. So, the throughput has been improved as compared with conventional apparatuses.

Figure 15B:
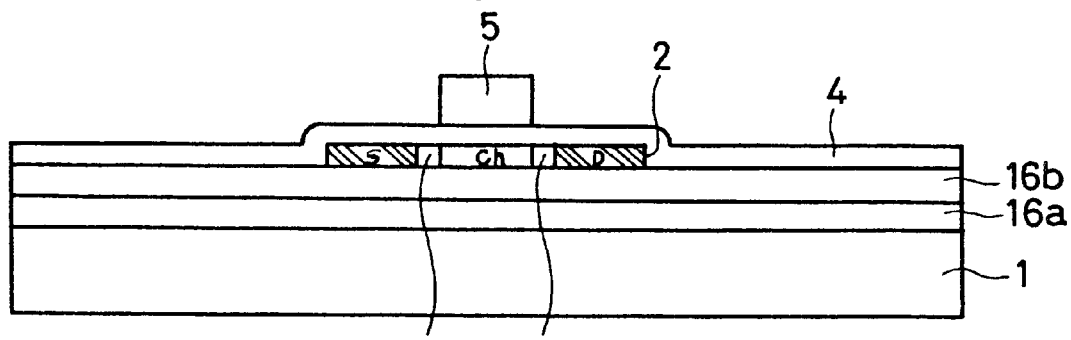

After that, as shown in FIG. 15B, the semiconductor thin film 2 made of polycrystalline silicon, which is remedied in crystal defects and enlarged in crystal grain size, is patterned in the form of islands. Grown thereon is $SiO_2$ up to 50 through 400 nm by plasma CVD, normal pressure CVD, low pressure CVD, ECR-CVD or sputtering, for example, to form a gate insulating film 4. If necessary, $V_{th}$ ion implantation may be done to inject $B^+$ ions into the semiconductor thin film 2 by a dose amount in the level of $0.5 \times 10^{12}$ through $4 \times 10^{12}/cm^2$, for example. In this case, acceleration voltage is about 80 keV. This $V_{th}$ ion implantation may be done before the gate insulating film 4 is formed. After that, Al, Ti, Mo, W, Ta, doped polycrystalline silicon, or an alloy of any of these materials is deposited on the gate insulating film 4 up to a thickness of 200 through 800 nm, and it is patterned into a predetermined configuration to form the gate electrode 5. Subsequently, $P^+$ ions are injected into the semiconductor thin film 2 by ion implantation using mass separation to form an LDD region. This ion implantation is done over the entire surface of the insulating substrate 1, using the gate electrode 5 as a mask. The dose amount is $6\times10^{12}$ through $5\times10^{13}$/cm$^2$. The channel region Ch located immediately below the gate electrode 5 is protected, and B$^+$ ions previously injected by V$_{th}$ ion implantation are maintained there. After ion implantation to the LDD region, a resist pattern is formed to cover the gate electrode 5 and its surrounding area, and P$^+$ ions are injected to a high concentration by ion shower doing of a mass non-separation type to form the source region S and the drain region D. In this case, the dose amount is about $1\times10^{15}$/cm$^2$, for example. For formation of the source region S and the drain region D, a mass separation type ion implantation apparatus may be used. After that, the dopant injected into the semiconductor thin film 2 is activated. This activation process may be done by laser annealing.

Figure 15C:
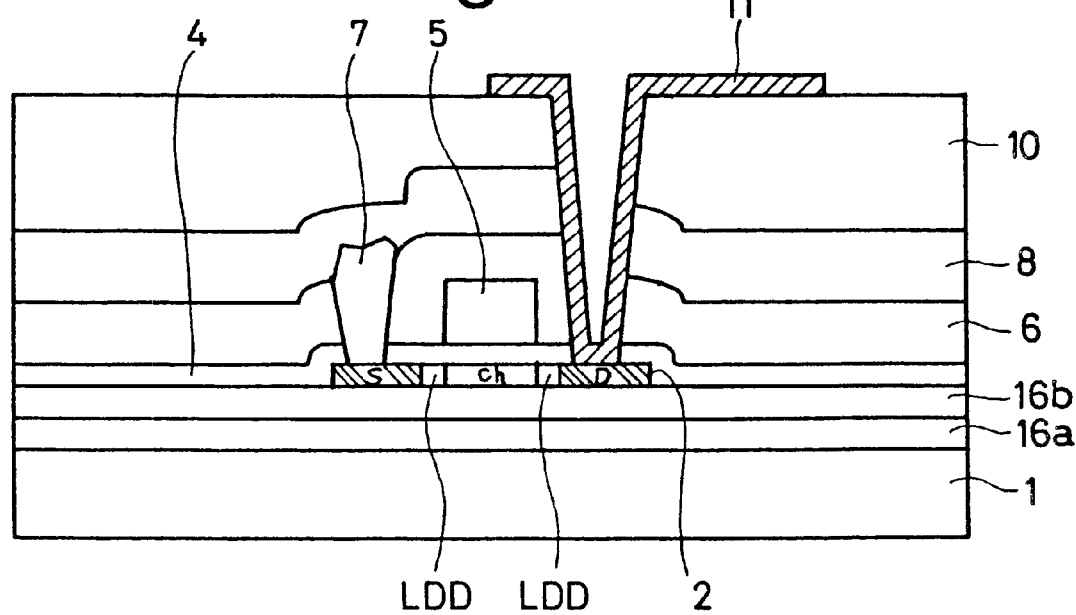

Finally, as shown in FIG. 15C, an inter-layer insulating film 6 of PSG, for example, is stacked to cover the gate electrode 5. After some contact holes are opened in the inter-layer insulating film 6, Al-Si, for example, is stacked by sputtering, and then patterned into a predetermined configuration to form the wiring electrode 7. Then, SiN$_x$ is stacked as a passivation film (cap layer) 8 to about 200 through 400 nm by plasma CVD so as to cover the wiring electrode 7. In this stage, so-called hydrogenation is conducted to improve the property of thin film transistors, which includes annealing in nitrogen gas at the temperature of 350° C. for one hour and diffusion of hydrogen contained in the inter-layer insulating film 6 into the semiconductor thin film 2. After a smoothing layer 10 of acrylic resin, for example, is coated on the passivation film 8 to a thickness around 1 μm, contact holes are opened therethrough. Then, a transparent conductive film of ITO or IXO is stacked on the smoothing layer 10 by sputtering, and patterned into a predetermined configuration to form the pixel electrodes 11.

Figure 16:
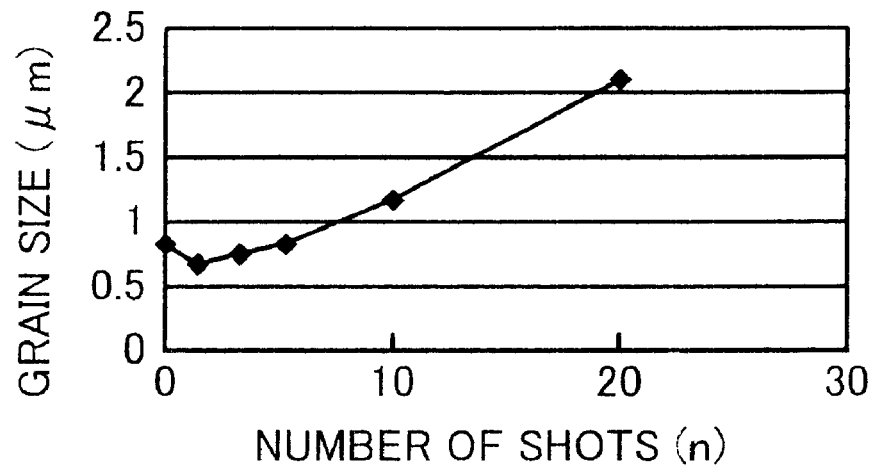
FIG. 16 is a graph showing relation between the number of times of laser light irradiation and the grain size of a polycrystalline semiconductor thin film.

FIG. 16 is a graph showing the relation between the repeated number of irradiation (number of shots) of pulse-mode laser light and the grain size of crystal grains contained in the polycrystalline semiconductor thin film 2. The data shown in FIG. 16 is a measured value, and laser light having a cross-sectional area not smaller than 5 cm$^2$ is irradiated in the form of pulses with the period of ⅙ Hz by using an excimer laser source. Emission time (pulse width) of the laser light is set in 200 ns. As apparent from the graph, by repeatedly irradiating pulse-mode laser light 5 to 20 times, crystal grains exceed 1 μm and reach 2 μm. The irradiation frequency of laser light had better be larger, and longer emission time give a better result. In general, the optimum number of irradiation (number of shots) varies with frequency and emission time.

Figure 17:
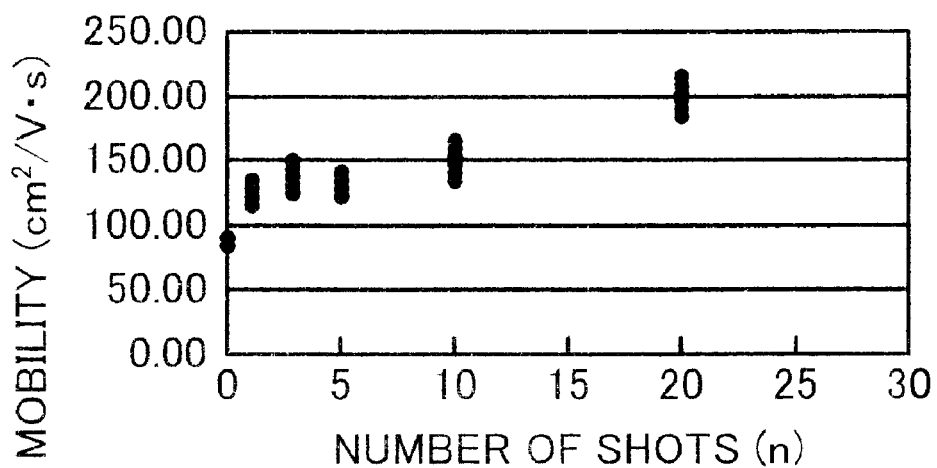
FIG. 17 is a graph showing relation between the number of times of laser light irradiation and the mobility of the thin film transistor.

FIG. 17 contains measured data demonstrating the relation between the number of shots and the mobility of thin film transistors. As apparent from the graph, as the number of shots increases, the crystal grain size increases, and it results in improving the mobility of the thin film transistors. For example, when the number of shots n is 20, the mobility of the n-channel thin film transistors reaches 200 cm$^2$/V·s.

Figure 18:
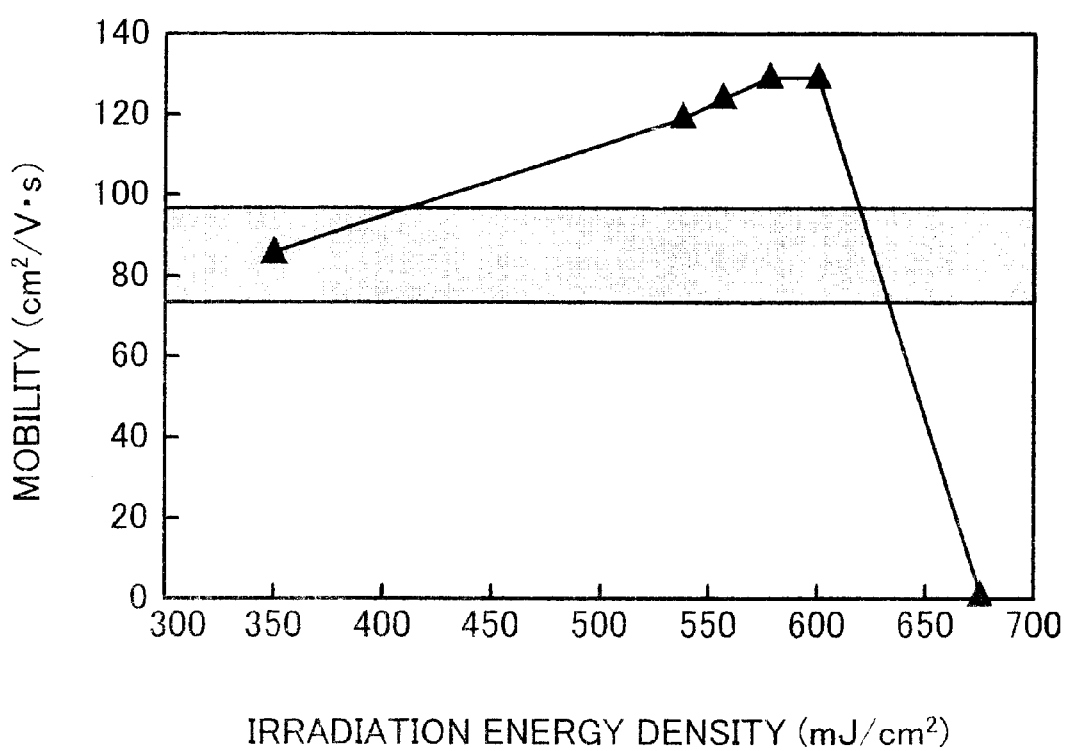
FIG. 18 is a graph showing relation between irradiation energy density of laser light and mobility of thin film transistors.

FIG. 18 is a graph showing the relation between the irradiation energy density of laser light and the mobility of n-channel thin film transistors. The belt-like portion in the graph indicates the mobility of thin film transistors including polycrystalline silicon formed by typical solid phase growth as their active layer, and it is in the range from 80 to 100 cm$^2$/V·s, approximately. In contrast, in the present invention, by setting the irradiation energy density per each shot of excimer laser light to 400 through 600 mJ/cm$^2$, a higher mobility than conventional ones can be obtained. By repeating this, the mobility can be increased to about 200 cm$^2$/V·s as shown in FIG. 18.

As explained above, according to an aspect of the invention, by using excimer laser light whose pulse width is not shorter than 50 ns and shaping the beam size to 10 mm×10 mm or more, for example, the excimer laser light is irradiated while being moved step by step so that there is produced a portion on the semiconductor thin film preferably made of amorphous silicon, which is irradiated at least twice. By choosing an appropriate number of shots according to the specification of the active matrix display device to be manufactured, polycrystalline silicon having crystal grain sizes and uniformity meeting the requirement can be built in over the entire surface of the substrate. As a result, a high-quality active matrix display device can be manufactured. Especially, it is possible to manufacture a so-called system-on-panel with an additional value, which contains all peripheral circuits like a video driver and a timing generator in addition to scanners inside the panel. So, its effect is great.

According to the second aspect of the invention, by using pulse-mode laser light having an emission time not shorter than 100 nm and irradiating the semiconductor thin film with an energy not inviting destruction of crystal grains, residual defects are removed from crystal grains. As a result of this process, it is possible to make a semiconductor thin film made of polycrystalline silicon having less crystal defects and larger grain sizes. So, it contributes to increasing the mobility of thin film transistors. Additionally, if a mobility equivalent to conventional ones is acceptable, the time for solid phase growth of the polycrystalline semiconductor thin film can be shortened, thereby improving productivity. Furthermore, according to the invention, by combining chemical vapor deposition using a catalyst with laser annealing, it is possible to efficiently make a high-quality polycrystalline semiconductor thin film in a low-temperature process.

Moreover, according to the third aspect of the invention, since pulse-mode laser light having an emission time not shorter than 50 ns is irradiated onto the semiconductor thin film to not only remove residual defects from crystal grains but also enlarge the crystal grains, a polycrystalline silicon thin film having less crystal defects and larger grain sizes can be formed on the insulating substrate, and thin film transistors having a high mobility can be obtained. It is therefore possible to manufacture display devices, etc. having a large additional value, which contains built-in peripheral circuits in the panel. Additionally, since any mobility necessary for a target system like a display device, etc. can be selected by adjusting the number of shots of irradiation, devices not requiring a very high mobility can be manufactured with a high throughput in the same manufacturing line as that of devices required to have a high mobility.

What is claimed is:

1. A method for manufacturing a thin film semiconductor device comprising:
   a film-making step for forming a semiconductor thin film of a non-single crystal on one surface of an insulating substrate; and
   an annealing step for irradiating laser light and changing said semiconductor thin film of the non-single crystal into a polycrystal,
   said annealing step irradiating laser light with a pulse width not shorter than 50 ns onto said semiconductor thin film by using an excimer laser source,
   wherein said annealing step shaped the laser light to have a rectangular cross-sectional area whose each side is not smaller than a predetermined dimension, and then sequentially irradiates the surface of the semiconductor thin film while moving laser light step by step so that the rectangular cross-sectional areas partly overlap along their sides.

2. The method for manufacturing a thin film semiconductor device according to claim 1 wherein said annealing step sets the number of irradiation of laser light per each stepping movement so that the number of irradiation shots of laser light repeated on a particular portion of the surface of the semiconductor thin film reaches a desired number.

3. A method for manufacturing a display device which includes a pair of substrates bonded to each other via a predetermined gap and an electrooptic substance held in the gap, transparent one of the substrates having formed an opposite electrode, and the other insulating substrate having formed a pixel electrode and a thin film transistor for driving the pixel electrode, which includes:
   a film-making step for making a non-single-crystalline semiconductor thin film on one surface of said insulating substrate;
   an annealing step for irradiating laser light to once heat and melt the non-single-crystalline semiconductor thin film, and the changing it to a polycrystal in its cooling process; and
   a processing step for forming in an integrated form said thin film transistor including the semiconductor thin film changed into a polycrystal as its active layer, characterized in that:
      said annealing step uses an excimer laser source and irradiates laser light having a pulse width not shorter than 50 ns onto said semiconductor thin film.

4. A method for manufacturing a thin film transistor in which a multi-layered structure including a semiconductor thin film, a gate insulating film stacked on one surface of the semiconductor thin film, and a gate electrode stacked on the semiconductor thin film via the gate insulating film is formed on an insulating substrate, comprising:
   a forming step for forming a semiconductor thin film containing polycrystalline grains on the insulating substrate; and
   a laser annealing step for using pulse-mode laser light having an emission time not shorter than 100 ns and irradiating said semiconductor thin film with an energy of a level not inviting destruction of crystal grains to remove residual defects from crystal grains,
   wherein said laser annealing step irradiates laser light onto said semiconductor thin film with an energy not lower than 500 mJ/cm$^2$ and not higher than 600 mJ/cm$^2$.

5. The method for manufacturing a thin film transistor according to claim 4 wherein said forming step includes a film-making step for stacking on the insulating substrate an amorphous semiconductor thin film or a polycrystalline semiconductor thin film including crystal grains with relatively small grain sizes, and a solid phase growth step for annealing said semiconductor thin film to grow crystal grains with relatively large grain sizes in solid phase.

6. The method for manufacturing a thin film transistor according to claim 4 wherein said forming step stacks a semiconductor thin film containing polycrystalline grains on the insulating substrate by chemical vapor deposition using a catalyst.

7. A method for manufacturing a thin film transistor in which a multi-layered structure including a semiconductor thin film, a gate insulating film stacked on one surface of the semiconductor thin film, and a gate electrode stacked on the semiconductor thin film via the gate insulating film is formed on an insulating substrate, comprising:
   a film-making step for an amorphous semiconductor thin film or a polycrystalline semiconductor thin film made of crystal grains with relatively small grain sizes on an insulating substrate;
   a solid phase growth step for annealing said semiconductor thin film to grow crystal grains with relatively large grain sizes in solid phase;
   a laser annealing step using pulse-mode laser light for irradiating said semiconductor thin film with an energy of a level not inviting destruction of large crystal grains to remove residual defects from crystal grains; and
   an additional solid growth step for again annealing said semiconductor thin film to grow crystal grains with still larger grain sizes in solid phase.

8. The method for manufacturing a thin film transistor according to claim 7 further comprising an additional laser annealing step after the additional solid phase growth step to again irradiate said semiconductor thin film with an energy of a level not inviting destruction of large crystal grains by using pulse-mode laser light and thereby remove defects produced in the additional solid phase growth step.

9. The method for manufacturing a thin film transistor according to claim 7 wherein said laser annealing step uses pulse-mode laser light having an emission time not shorter than 100 ns.

10. The method for manufacturing a thin film transistor according to claim 7 wherein said laser annealing step irradiates laser light onto said semiconductor thin film with an energy not higher than 600 mJ/cm$^2$.

11. A method for manufacturing a display device including a pair of substrates bonded to each other via a predetermined gap and an electrooptic substance held in said gap, one of said substrates having formed an opposite electrode and the other of the substrates having formed a pixel electrode and a thin film transistor for driving the pixel electrode, and said thin film transistor being made of a semiconductor thin film and a gate electrode stacked on one surface of the semiconductor thin film via a gate insulating film, comprising:
   a film-making step for stacking on an insulating substrate an amorphous semiconductor thin film or a polycrystalline semiconductor thin film including made up of crystal grains with relatively large grain sizes;
   a solid phase growth step for annealing said semiconductor thin film to grow crystal grains with relatively large grain sizes in solid phase; and
   a laser annealing step for irradiating said semiconductor thin film by using pulse-mode laser light having an emission time not shorter than 100 ns with an energy of a level not inviting destruction of large crystal grains to remove residual defects from crystal grains.

12. A method for manufacturing a display device including a pair of substrates bonded to each other via a predetermined gap and an electrooptic substance held in said gap, one of said substrates having formed an opposite electrode and the other of the substrates having formed a pixel electrode and a thin film transistor for driving the pixel electrode, and said thin film transistor being made of a semiconductor thin film and a gate electrode stacked on one surface of the semiconductor thin film via a gate insulating film, comprising:
   a film-making step for stacking on an insulating substrate an amorphous semiconductor thin film or a polycrystalline semiconductor thin film including made up of crystal grains with relatively large grain sizes;
   a solid phase growth step for annealing said semiconductor thin film to grow crystal grains with relatively large grain sizes in solid phase;

a laser annealing step for irradiating said semiconductor thin film by using pulse-mode laser light with an energy of a level not inviting destruction of large crystal grains to remove residual defects from crystal grains; and an additional solid phase growth step for again annealing said semiconductor thin film to grow crystal grains with still larger grain sizes in solid phase.

13. The method for manufacturing a display device according to claim 12 further comprising an additional laser annealing step after the additional solid phase growth step to again irradiate said semiconductor thin film by using pulse-mode laser light with an energy of a level not inviting destruction of large crystal grains to remove defects produced in the additional solid phase growth step.

14. A method for making a semiconductor thin film comprising:

a forming step for making a semiconductor thin film on an insulating substrate at a temperature not higher than 400° C. by chemical vapor deposition using a catalyst; and a laser annealing step for irradiating pulse-mode laser light having an emission time not shorter than 100 ns onto the insulating substrate to improve the quality of said semiconductor thin film.

15. The method for making a semiconductor thin film according to claim 14 wherein said forming step makes a polycrystalline semiconductor thin film containing crystal grains by chemical vapor deposition using a catalyst, and said laser annealing step irradiates laser light with an energy of a level not inviting destruction of said crystal grains to remove defects existing in said crystal grains.

16. The method for making a semiconductor thin film according to claim 14 wherein said forming step makes on the insulating substrate a semiconductor thin film having a hydrogen content not higher than 1% and a thickness not larger than 50 nm by chemical vapor deposition using a catalyst.

17. The method for making a semiconductor thin film according to claim 14 wherein said forming step makes a semiconductor thin film on the insulating substrate in a reaction chamber which can be evacuated, and said laser annealing step irradiates laser light onto the insulating substrate without breaking the evacuated condition of the reaction chamber.

18. The method for making a semiconductor thin film according to claim 14 wherein said forming step and said laser annealing step are alternately repeated until said semiconductor thin film is stacked to a desired thickness.

19. A method for manufacturing a thin film transistor in which a multi-layered structure including a semiconductor thin film, a gate insulating film stacked on one surface of the semiconductor thin film, and a gate electrode stacked on the semiconductor thin film via the gate insulating film is formed on an insulating substrate, comprising:

a forming step for making a semiconductor thin film containing, polycrystalline grains on the insulating substrate; and a laser annealing step for irradiating pulse-mode laser light having an emission time not shorter than 50 ns onto said semiconductor thin film to remove residual defects from crystal grains and enlarge the crystal grains, wherein said laser annealing step repeats irradiation of pulse-mode laser light certain times necessary to enlarge the crystal grains to a desired size.

20. The method for manufacturing a thin film transistor according to claim 19 wherein said laser annealing step repeatedly irradiates pulse-mode laser light with the period not lower than ⅙ Hz.

21. The method for manufacturing a thin film transistor according to claim 19 wherein said laser annealing step irradiates laser light onto said semiconductor thin film with an energy density not lower than 400 mJ/cm$^2$ and not higher than 600 mJ/cm$^2$.

22. The method for manufacturing a thin film transistor according to claim 19 wherein said laser annealing step uses pulse-mode laser light having an emission time not shorter than 100 ns.

23. The method for manufacturing a thin film transistor according to claim 19 wherein said laser annealing step irradiates laser light having an irradiation area not smaller than 5 cm$^2$ onto said semiconductor thin film.

24. The method for manufacturing a thin film transistor according to claim 19 wherein said forming step includes a film-making step for stacking an amorphous semiconductor thin film or a polycrystalline semiconductor thin film made up of crystal grains with relatively small grain sizes on an insulating substrate, and a solid phase growth step for annealing said semiconductor thin film to grow crystal grains with relative large grain sizes in solid phase.

25. The method for manufacturing a thin film transistor according to claim 19 wherein said forming step stacks a semiconductor thin film containing polycrystalline grains on the insulating substrate by chemical vapor deposition using a catalyst.

* * * * *